(12) United States Patent
Tsai et al.

(10) Patent No.: US 12,301,225 B2
(45) Date of Patent: May 13, 2025

(54) SYSTEMS AND METHODS FOR TUNING CAPACITANCE IN QUANTUM DEVICES

(71) Applicant: 1372934 B.C. LTD., Burnaby (CA)

(72) Inventors: Min Jan Tsai, Richmond (CA); Emile M. Hoskinson, Vancouver (CA); Mark H. Volkmann, Burnaby (CA)

(73) Assignee: 1372934 B.C. LTD., Burnaby (CA)

( * ) Notice: Subject to any disclaimer, the term of this patent is extended or adjusted under 35 U.S.C. 154(b) by 0 days.

(21) Appl. No.: 18/291,056

(22) PCT Filed: Jul. 21, 2022

(86) PCT No.: PCT/US2022/037877
§ 371 (c)(1),
(2) Date: Jan. 22, 2024

(87) PCT Pub. No.: WO2023/004040
PCT Pub. Date: Jan. 26, 2023

(65) Prior Publication Data
US 2024/0333286 A1    Oct. 3, 2024

Related U.S. Application Data

(60) Provisional application No. 63/225,022, filed on Jul. 23, 2021.

(51) Int. Cl.
*H03K 17/92*    (2006.01)

(52) U.S. Cl.
CPC .................................. *H03K 17/92* (2013.01)

(58) Field of Classification Search
CPC ..................................................... H03K 17/92
(Continued)

(56) References Cited

U.S. PATENT DOCUMENTS

| 6,128,764 A | 10/2000 | Gottesman |
| 6,157,044 A | 12/2000 | Nakanishi et al. |

(Continued)

FOREIGN PATENT DOCUMENTS

| EP | 1085422 A2 | 3/2001 |
| EP | 3665624 B1 | 4/2024 |

(Continued)

OTHER PUBLICATIONS

Aassime et al., "Radio-frequency Single-electron Transistor as Readout Device for Qubits: charge sensitivity and backaction", Phys Rev Lett 86, pp. 3376-3379, 2001.

(Continued)

*Primary Examiner* — Tomi Skibinski
(74) *Attorney, Agent, or Firm* — Cozen O'Connor

(57) ABSTRACT

Systems and methods for capacitance tuning of devices in quantum processors are described. One implementation is a quantum processor with a first current path having a first loop, a Josephson structure with at least one Josephson junction interrupting the first loop, a second current path connected to the first current path, and a flux bias. The second current path has a first node spaced from a second node, a capacitor separating the first node and the second node, and a voltage gain tuner, the voltage gain tuner being inductively coupled to the inductance of the first current path. The flux bias is coupled to the voltage gain tuner and controls the voltage gain tuner to vary a voltage ratio between the first node and the second node, thereby influencing the capacitance of the first current path.

17 Claims, 9 Drawing Sheets

(58) Field of Classification Search
USPC ........................................................ 327/528
See application file for complete search history.

(56) References Cited

U.S. PATENT DOCUMENTS

| | | |
|---|---|---|
| 6,169,981 B1 | 1/2001 | Werbos |
| 6,317,766 B1 | 11/2001 | Grover |
| 6,360,112 B1 | 3/2002 | Mizuno et al. |
| 6,459,097 B1 | 10/2002 | Zagoskin |
| 6,504,172 B2 | 1/2003 | Zagoskin et al. |
| 6,563,310 B2 | 5/2003 | Zagoskin |
| 6,563,311 B2 | 5/2003 | Zagoskin |
| 6,605,822 B1 | 8/2003 | Blais et al. |
| 6,614,047 B2 | 9/2003 | Tzalenchuk et al. |
| 6,627,915 B1 | 9/2003 | Ustinov et al. |
| 6,627,916 B2 | 9/2003 | Amin et al. |
| 6,633,053 B1 | 10/2003 | Jaeger |
| 6,649,929 B2 | 11/2003 | Newns et al. |
| 6,728,131 B2 | 4/2004 | Ustinov |
| 6,753,546 B2 | 6/2004 | Tzalenchuk et al. |
| 6,803,599 B2 | 10/2004 | Amin et al. |
| 6,838,694 B2 | 1/2005 | Esteve et al. |
| 6,885,325 B2 | 4/2005 | Omelyanchouk et al. |
| 6,900,454 B2 | 5/2005 | Blais et al. |
| 6,911,664 B2 | 6/2005 | Il et al. |
| 6,919,579 B2 | 7/2005 | Amin et al. |
| 6,936,841 B2 | 8/2005 | Amin et al. |
| 6,943,368 B2 | 9/2005 | Amin et al. |
| 6,978,070 B1 | 12/2005 | Mccarthy et al. |
| 6,979,836 B2 | 12/2005 | Zagoskin et al. |
| 6,984,846 B2 | 1/2006 | Newns et al. |
| 7,002,174 B2 | 2/2006 | Il et al. |
| 7,015,499 B1 | 3/2006 | Zagoskin |
| 7,133,888 B2 | 11/2006 | Kohn et al. |
| 7,135,701 B2 | 11/2006 | Amin et al. |
| 7,230,266 B2 | 6/2007 | Hilton et al. |
| 7,253,654 B2 | 8/2007 | Amin |
| 7,307,275 B2 | 12/2007 | Lidar et al. |
| 7,335,909 B2 | 2/2008 | Amin et al. |
| 7,533,068 B2 | 5/2009 | Maassen et al. |
| 7,605,600 B2 | 10/2009 | Harris |
| 7,613,764 B1 | 11/2009 | Hilton et al. |
| 7,624,088 B2 | 11/2009 | Johnson et al. |
| 7,639,035 B2 | 12/2009 | Berkley |
| 7,843,209 B2 | 11/2010 | Berkley |
| 7,876,248 B2 | 1/2011 | Berkley et al. |
| 7,880,529 B2 | 2/2011 | Amin |
| 7,898,282 B2 | 3/2011 | Harris et al. |
| 8,098,179 B2 | 1/2012 | Bunyk et al. |
| 8,102,185 B2 | 1/2012 | Johansson et al. |
| 8,169,231 B2 | 5/2012 | Berkley |
| 8,190,548 B2 | 5/2012 | Choi |
| 8,195,596 B2 | 6/2012 | Rose et al. |
| 8,421,053 B2 | 4/2013 | Bunyk et al. |
| 8,536,566 B2 | 9/2013 | Johansson et al. |
| 8,611,974 B2 | 12/2013 | Maibaum et al. |
| 8,644,898 B1 | 2/2014 | De Andrade et al. |
| 8,854,074 B2 | 10/2014 | Berkley |
| 8,951,808 B2 | 2/2015 | Ladizinsky et al. |
| 9,015,215 B2 | 4/2015 | Berkley et al. |
| 9,495,644 B2 | 11/2016 | Chudak et al. |
| 9,870,277 B2 | 1/2018 | Berkley |
| 10,037,493 B2 | 7/2018 | Harris et al. |
| 10,068,180 B2 | 9/2018 | Amin et al. |
| 10,312,141 B2 | 6/2019 | Kirby et al. |
| 10,528,886 B2 | 1/2020 | Boothby |
| 10,552,755 B2 | 2/2020 | Lanting et al. |
| 10,938,346 B2 | 3/2021 | Berkley et al. |
| 11,127,893 B2 | 9/2021 | Johnson et al. |
| 11,182,230 B2 | 11/2021 | Berkley et al. |
| 11,424,521 B2 | 8/2022 | Whittaker et al. |
| 11,494,683 B2 | 11/2022 | Amin et al. |
| 2002/0060635 A1 | 5/2002 | Gupta |
| 2002/0179937 A1 | 12/2002 | Ivanov et al. |
| 2002/0180006 A1 | 12/2002 | Franz et al. |
| 2003/0016069 A1 | 1/2003 | Furuta et al. |
| 2004/0016918 A1 | 1/2004 | Amin et al. |
| 2004/0071019 A1 | 4/2004 | Magnus et al. |
| 2005/0047245 A1 | 3/2005 | Furuta et al. |
| 2006/0147154 A1 | 7/2006 | Thom et al. |
| 2009/0322374 A1 | 12/2009 | Przybysz et al. |
| 2012/0124432 A1 | 5/2012 | Pesetski et al. |
| 2014/0229722 A1 | 8/2014 | Harris |
| 2015/0219730 A1 | 8/2015 | Tsukamoto et al. |
| 2015/0263736 A1 | 9/2015 | Herr et al. |
| 2016/0335558 A1 | 11/2016 | Bunyk et al. |
| 2017/0256698 A1 | 9/2017 | Nayfeh et al. |
| 2018/0054201 A1 | 2/2018 | Reagor et al. |
| 2018/0247217 A1 | 8/2018 | Heeres et al. |
| 2018/0341874 A1 | 11/2018 | Puri et al. |
| 2019/0019098 A1 | 1/2019 | Przybysz |
| 2019/0164959 A1 | 5/2019 | Thomas et al. |
| 2019/0237648 A1 | 8/2019 | Przybysz et al. |
| 2019/0392878 A1 | 12/2019 | Murduck et al. |
| 2020/0036332 A1 | 1/2020 | Abdo |
| 2020/0090738 A1 | 3/2020 | Naaman et al. |
| 2020/0401649 A1 | 12/2020 | Lanting |
| 2020/0411937 A1* | 12/2020 | Whittaker ............... G06N 10/40 |
| 2021/0013391 A1 | 1/2021 | Johnson et al. |
| 2021/0073667 A1* | 3/2021 | Harris ................... G06N 10/40 |
| 2021/0190885 A1 | 6/2021 | Swenson et al. |
| 2021/0248506 A1 | 8/2021 | Hoskinson et al. |
| 2022/0123048 A1 | 4/2022 | Swenson et al. |
| 2023/0027682 A1 | 1/2023 | Molavi et al. |
| 2023/0106489 A1 | 4/2023 | Harris |
| 2023/0370069 A1 | 11/2023 | Amin et al. |

FOREIGN PATENT DOCUMENTS

| | | |
|---|---|---|
| KR | 20190015330 A | 2/2019 |
| WO | 2015013532 A1 | 1/2015 |
| WO | 2022155140 A1 | 7/2022 |
| WO | 2023004040 A1 | 1/2023 |
| WO | 2023114811 A1 | 6/2023 |
| WO | 2023219656 A2 | 11/2023 |
| WO | 2024050333 A1 | 3/2024 |
| WO | 2024102504 A2 | 5/2024 |
| WO | 2024172854 A2 | 8/2024 |

OTHER PUBLICATIONS

Allman, et al., "RFSQUID-Mediated Coherent Tunable Coupling Between a Superconducting Phase Qubit and a Lumped Element Resonator", arXiv:1001.0816v1 [cond-mat.supr-con], Jan. 6, 2010.

Al-Saidi et al., "Eigenstates of a small Josephson junction coupled to a resonant cavity", Physical Review B, 65, pp. 014512-1 to 014512-7, 2001.

Amin et al., "Thermally assisted adiabatic quantum computation," arXiv:cond-mat/0609332v2, pp. 1-5, (Mar. 2, 2007) Feb. 1, 2006.

Amin, "Effect of Local Minima on Adiabatic Quantum Optimization," arXiv:0709.0528v2, Apr. 4, 2008, https://arxiv.org/abs/0709.0528v2.

Anton, et al., "Magnetic Flux Noise in dc SQUIDs: Temperature and Geometry Dependence", Physical Review Letters, PRL 110, 147002, Apr. 5, 2013.

Armour et al., "Entanglement and Decoherence of a Micromechanical Resonator via Coupling to a Cooper Box", Physical Review Letters, 88, pp. 148304-1 to 148301-4, 2002.

Ataides, et al., "The XZZX surface code", Nature Communications, https://doi.org/10.1038/s41467-021-22274-1, 2021, 12 pages.

Auger James M. Fault-tolerance thresholds for the surface code with fabrication errors, arXiv:1706.04912v1, Jun. 15, 2017.

Averin et al., "Quantum Computing and Quantum Measurements With Mesoscopic Josephson Junctions", Fortschritte der Physik 48, pp. 1055-1074, 2000.

Averin et al., "Variable Electrostatic Transformer: Controllable Coupling of Two Charge Qubits," Physical Review Letters 91(5): 057003-1-057003-4, Aug. 1, 2003. arXiv:cond-mat/0304166v1, Apr. 7, 2003.

(56) References Cited

OTHER PUBLICATIONS

Barends R. et al., "Coherent Josephson qubit suitable for scalable quantum integrated circuits," arXiv:1304.2322v1 [quant-ph], Apr. 8, 2013, 10 pages.

Barends, et al., Logic Gates at the Surface Code Threshold: Superconducting Qubits Poised for Fault-tolerant Quantum Computing, 2014, arXiv:1402.4848.

Barone et al., "Quantum Computation With Aharonov-Bohm Qubits", WWW.arXiv.org preprint: cond-mat/0203038 v1 (Mar. 2, 2002).

Barrett, et al., "Fault Tolerant Quantum Computation with Very High Threshold for Loss Errors", Phys. Rev. Lett. 105, 200502—Published Nov. 9, 2010, 4 pages.

Baust,, Characterization of Flux-driven Josephson Parametric Amplifiers, Diploma Thesis, Technische Universitat Munchen, Aug. 2010, 119 pages.

Bell et al., "Traveling Wave Parametric Amplifier based on a chain of Coupled Asymmetric SQUIDs", arXiv:1509.04573 [cond-mat.supr-con], Sep. 15, 2015.

Bell, et al, "SQUID Based Superconducting Traveling-Wave Parametric Amplifier", IEEE/CSC & ESAS Superconductivity News Forum (global edition), Oct. 2014, 3 pages.

Benjamin, Quantum Computing Without Local Control of Qubit-Qubit Interactions, 2001, 4 pages.

Biamonte et al., "Realizable Hamiltonians for universal adiabatic quantum computers," arXiv:0704.1287v2, Jun. 17, 2008, 7 pages.

Blais et al., "Operation of universal gates in a solid-state quantum computer based on clean Josephson junctions between d-wave superconductors", Physical Review A, 61, 042308, 2000.

Blais et al., "Quantum netWork optimization", Physical RevieW A, 64, pp. 022312-1 to 022312-5 (2001).

Blais et al., "Tunable Coupling of Superconducting Qubits," arXiv:cond-mat/0207112v3 [cond-mat.mes-hall], Mar. 18, 2003, 4 pages.

Blais, et al., "Cavity quantum electrodynamics for superconducting electrical circuits an architecture for quantum computation", arXiv:cond-mat/0402216v1, Feb. 7, 2004, pp. 1-14 (Year:2004).

Blatter et al., "Design aspects of superconducting-phase quantum bits," Physical Review B 63: 174511-1-174511-9, 2001.

Bravyi et al., "The Complexity of Stoquastic Local Hamiltonian Problems," arXiv:quant-ph/0606140v4, Oct. 2, 2007, 21 pages.

Bravyi, et al., "Hight-threshold and low-overhead fault-tolerant quantum memory", arXiv:2308.07915v1 [quant-ph] Aug. 15, 2023, 38 pages.

Bravyi, et al., "Universal quantum computation with ideal Clifford gates and noisy ancillas", arXiv:quant-ph/0403025v2 Dec. 16, 2004, 15 pages.

Brennen et al., "Why should anyone care about computing with anyons?," arXiv:0704.2241v1 [quant-ph], pp. 1-12, Apr. 18, 2007.

Brown, et al., "A fault-tolerant non-Clifford gate for the surface code in two dimensions", Science Advances, May 22, 2020, vol. 6, Issue 21, 25 pages.

Buisson et al., "Entangled states in a Josephson charge qubit coupled to a superconducting resonator", arXiv.org: cond/mat/0008275v1, Aug. 18, 2000.

Burkard et al., "Spintronics and Quantum Dots for Quantum Computing and Quantum Communication," Fortschritte der Physik 48, pp. 965-986, 2000.

Carelli et al., "SQUID Systems for Macroscopic Quantum Coherence and Quantum Computing", IEEE trans. Apple. Supercond., Mar. 1, 2001. https://ieeexplore.ieee.org/document/919321.

Chamberland et al, "Building a Fault-Tolerant Quantum Computer Using Concatenated Cat Codes", arXiv:2012.04108v2 [quant-ph] Jan. 27, 2022, 117 page.

Chamon, et al., "A superconducting circuit realization of combinatorial gauge symmetry", arXiv:2006.10060v1 [quant-ph] Jun. 17, 2020, 9 pages.

Chancellor et al., "Circuit design for multi-body interactions in superconducting quantum annealing systems with applications to a scalable architecture", arXiv:1603.09521v5, Oct. 13, 2017.

Chancellor, et al., "Scalable Universal Holonomic Quantum Computation Realized with an Adiabatic Quantum Data Bus and Potential Implementation Using Superconducting Flux Qubits", arXiv:1301.7100v3 [quant-ph], Mar. 21, 2013, 10 pages.

Chapman et al., "General Purpose Multiplexing Device for Cryogenic Microwave Systems," arXiv:1603.02716v2 [quant-ph] May 31, 2016, 10 pages.

Chow, et al., "Complete Universal Quantum Gate Set Approaching Fault-tolerant Thresholds with Superconducting Qubits", arXiv:1202.5344v1 [quant-ph], Feb. 23, 2012, 13 pages., Control Systems bucket—new refs Re: IDF 13022, 14020, 14028, and 14030.

Christopher Eichler et al., 'Controlling the dynamic range of a Josephson parametric amplifier', EPJ Quantum Technology, vol. 1, No. 2, Jan. 29, 2014.

Clarke et al., "Quiet Readout of Superconducting Flux States," Physica Scripta. T102: 173-177, 2002.

Clarke et al., "Superconducting quantum bits," Nature 453:1031-1042, Jun. 19, 2008.

Cory et al., "NMR Based Quantum Information Processing: Achievements and Prospects", Fortschritte der Physik 48, pp. 875-907, 2000.

Cosmelli et al, "An Integrated System of SQUIDs for the Study of Macroscopic Quantum Coherence", Supercond. Sci. Technol. 14, 2001.

Cosmelli, C., "Controllable Flux Coupling for the Integration of Flux Qubits," arXiv:cond-mat/0403690v1 [cond-mat.supr-con]. Mar. 29, 2004, 10 pages.

Cottet et al., "Implementation of a combined charge—phase quantum bit in a superconducting circuit", Physica C 367, pp. 197-203, 2002.

Devitt, Quantum Error Correction for Beginners, arXiv: 0905.2794v4 [quant-ph], Jun. 21, 2013.

Devoret et al., "Superconducting Circuits for Quantum Information: An Outlook," Science 339:1169-1174, Mar. 8, 2013.

Devoret et al., "Superconducting Qubits: A Short Review," arXiv:cond-mat/0411174v1, Nov. 7, 2004, 41 pages.

Devoret, "Josephson-based Parametric Amplifiers for Quantum Measurements", Quantum-Mechanical Electronics Lab, Applied Physics and Physics, Yale University, Nov. 9, 92 pages, 2009.

Devoret, et al., "Introduction to Quantum-limited parametric Amplification of Quantum Signals with Josephson Circuits", arXiv:1605.00539v2, May 25, 2016, 28 pages.

DiVincenzo et al., "Experimental Proposals for Quantum Computaton", H-K Lo and S.L. Braunstein (eds.), chapter 1, Wiley-VCH Verlag GmbH, Berlin (2001), also published WWW. ArXiv.org preprint: quant-ph/0002077 (Apr. 13, 2000).

Dykman, "Quantum Computing Using Electrons Floating on Liquid Helium", Fortschritte der Physik 48, pp. 1095-1108, 2000.

Economist, Quantum Dreams, Economist, pp. 1-3 (Mar. 8, 2001).

Eddins, et al, "Josephson Parametric Amplifiers: Theory and Application", Quantum Nanoelectronics Laboratory, Department of Physics, University of CA, Berkley, Workshop on Microwave Cavity Design for Axion Detection Livermore Valley Open Campus, Aug. 2015.

Farhi et al., "Quantum Adiabatic Evolution Algorithms versus Simulated Annealing," MIT-CTP #3228, arXiv:quant-ph/0201031 v1, pp. 1-16, Jan. 8, 2002.

Filippov et al., "Tunable Transformer for Qubits Based on Flux States," IEEE Transactions on Applied Superconductivity 13(2): 1-4, Jun. 2003.

Fowler, et al., "Surface codes: towards practical large-scale quantum computation", Phys. Rev. A 86, 032324—Published Sep. 18, 2012, 5 pages.

Friedman et al., "Aharonov-Casher-Effect Suppression of Macroscopic Tunneling of Magnetic Flux," arXiv:cond-mat/0109544v1 [cond-mat.mes-hall], Sep. 28, 2001, 9 pages.

Friedman et al., "Quantum superposition of distinct macroscopic states," Nature 406:43-46, Jul. 6, 2000.

Geerlings, et al., "Improving the Quality Factor of Microwave Compact Resonators by Optimizing Their Geometrical Parameters", arXiv:1204.0742v3 [cond-mat.supr-con], Jun. 5, 2012.

Ghiu et al., "Asymmetric two-output quantum processor in any dimension," arXiv:quant-ph/0610138v1, pp. 1-8, Oct. 17, 2006.

(56) References Cited

OTHER PUBLICATIONS

Gotz et al., "Harmonic current-phase relation in Nb-Al-based superconductor/ normal conductor/ superconductor-type Josephson junctions betWeen 4.2 K and the critical temperature", ApplPhys. Lett. 77, pp. 1354-1356 (2000).
Grangier et al., "Implementations of Quantum Computing Using Cavity Quantum Electrodynamics", Fortschritte der Physik 48, pp. 859-874, 2000.
Greenberg et al., "Low-frequency characterization of quantum tunneling in flux qubits", ArXiv.org preprint server: cond-mat/0208076, last accessed on Aug. 20, 2004.
Han et al., "Time-Resolved Measurement of Dissipation-Induced Decoherence in a Josephson Junction," Science 293:1457-1459, Aug. 24, 2001.
Harris et al., "A Compound Josephson Junction Coupler for Flux Qubits With Minimal Crosstalk," arXiv:0904.3784v3 [cond-mat.supr-con], Jul. 16, 2009, 5 pages.
Harris et al., "Experimental Demonstration of a Robust and Scalable Flux Qubit," arXiv:0909.4321v1, Sep. 24, 2009, 20 pages.
Harris et al., "Experimental Investigation of an Eight-Qubit Unit Cell in a Superconducting Optimization Processor," arXiv:1004.1628v2, Jun. 28, 2010, 16 pages.
Harris, Sign and Magnitude Tunable Coupler for Superconducting Flux Qubits, arXiv:cond-mat/0608253v1, Aug. 11, 2006.
Hekking et al., "Cooper Pair Box Coupled to a Current-Biased Josephson Junction", arXiv.org:cond-mat/0201284 (2002).
Hofheinz, et al., "Generation of Fock States in a Superconducting Quantum Circuit", Nature 454, pp. 310-314, Jul. 1, 2008.
Hofheinz, et al., "Synthesizing Arbitrary Quantum Staes in a Superconducting Resonator, Nature", vol. 459, pp. 546-549, May 28, 2009.
Horsman, et al., "Surface code quantum computing by lattice surgery", 2012 Journal of Physics, 14 123011, 28 pages.
Hu et al., "Decoherence and dephasing in spin-based solid state quantum computers", arXiv.org:cond-mat/0108339v2, Sep. 6, 2001, (2001).
Il'ichev et al., "Characterization of superconducting structures designed for qubit realizations", Appl. Phys. Lett. 80, pp. 4184-4186, 2002.
Il'ichev et al., "Degenerate Ground State in a Mesoscopic YBa2Cu3O7-x Grain Boundary Josephson Junction", Phys. Rev. Lett. 86, pp. 5369-5372, 2001.
Il'ichev et al., "Radio-frequency based monitoring of small supercurrents", Rev. Sci. Instrum. 72, pp. 1882-1887, 2001.
Il'ichev et al., "Radio-frequency method for characterization of superconducting weak links," Physica C 350, pp. 244-248, 2001.
Born et al., "Fabrication of Ultrasmall Tunnel Junctions by Electron Beam Direct-Writing", IEEE, 11(1) Mar. 2001, 4 pages., 11, pp. 373-376.
Ettinger et al., "An Integrated 20 GHZ SiGe Bipolar Differential Oscillator with High Tuning Range", 2000.
Wang, et al., "Quantum state characterization of a fast tunable superconducting resonator," Applied Physics Letters 102, 163503 (2013), 4 pages.
Ilichev, et al., "Continuous Monitoring of Rabi Oscillations in a Josephson Flux Qubit", Physical Review Letters 91(9): 097906-1-097906-4, week ending Aug. 19, 2003.
James et al., "Scanning Hall probe Microscope images of Field penetration into niobium fields", Physica C 332, pp. 445-449, 2000.
Johnson, et al; "A scalable control system for a superconducting adiabatic quantum optimization processor", Superconductor Science and Technology; IOP Publishing; Supercond. Sci. Technol. 23 (2010); vol. 23, No. 6, Jun. 1, 2010, 12 pages.
Jones et al., Tunable electromagnetic environment for supercomputing, Jun. 13, 2013, Scientific Reports, pp. 1-5 (Year:2013).
Jonker et al., "On quantum and classical computing with arrays of superconducting persistent current qubits", Proceedings fifth IEEE International workshop on computer architectures for machine perception, Padova, italy, Sep. 11-13, 2000, pp. 69-78,, Sep. 1, 2000.
Jordan, et al., "Perturbative Gadgets at Arbitrary Orders", arXiv:0802.1874v4 [quant-ph], Jan. 31, 2012.
Kane et al., "Silicon-based Quantum Computation", Fortschritte der Physik 48, pp. 1023-1041, 2000.
Kelly, et al., "Fault-tolerant Superconducting Qubits, Dissertations in fulfilment of Ph.D. in Physics", UC Santa Barbara, 2015.
Kjaergaard et al., "Superconducting Qubits: Current State of Play", arXiv:1905.13641v1, May 31, 2019.
Knill , QCThresholdAnalysis 2004.
Knill, Fault-Tolerant Postselected Quantum Computation: Schemes, arXiv:quant-ph/0402171v1, Feb. 23, 2004, 17 pages.
Krech, "Linear Microwave Response of a Charge-Type Qubit", IEEE Trans. Appl. Supercond. 11, pp. 1022-1025, 2001.
Kulik et al., "Quantum Computational Gates With Radiation Free Couplings", WWW.arXiv.org preprint1 cond-mat/0203313 v1 (Mar. 14, 2002).
LaFore st, "Flux-vector Model of Spin Noise in Superconducting Circuits: Electron Versus Nuclear Spins and Role of Phase Transition", arXiv: 1501.03776v3 [cond-mat.supr-con], Jul. 21, 2015.
Lanting, "Evidence for Temperature Dependent Spin-diffusion as a Mechanism of Intrinsic Flux Noise in SQUIDs", arXiv: 1306.1512v3 [cond-mat.supr-con], Dec. 23, 2013.
Lechner et al., "A quantum annealing architecture with all-to-all connectivity from local interactions", Science Advances., vol. 1, No. 19, Oct. 23, 2015.
Levitov, et al., "Quantum Spin Chains and Majorana States in Arrays of Coupled Qubits," arXiv:cond-mat/0108266v2 [cond-mat.mes-hall]. Aug. 19, 2001, 7 pages.
Lidar, "Towards Fault Tolerant Adiabatic Quantum Computation", arXiv: 0707.0021v3 [quant-ph], May 2, 2008.
Lidar et al., "Quantum Codes for Simplifying Design and Suppressing Decoherence in Superconducting Phase-Qubits", Quant. Inf. Proc. 1, pp. 155-182, 2002.
Lidar et al., "Reducing Constraints on Quantum Computer Design by Encoded Selective Recoupling", Phys. Rev. Lett. 88, 017905, pp. 1-4, 2002.
Litinski, et al., "A Game of Surface Codes: Large-Scale Quantum Computing with Lattice Surgery", arXuv:1808.0289.02892v3 [quant=ph] Feb. 3, 2019, 37 pages.
Macklin, et al., "A near-quantum-limited Josephson traveling-wave parametric amplifier", Science Sciencemag. org,, Oct. 16, 2015 , vol. 350, Issue 6258, 5 pages.
Majer et al., "Simple phase bias for superconducting circuits", Applied Physics Letters 80 pp. 3638-3640, 2002.
Makhlin et al., "Josephson-Junction Qubits", Fortschritte der Physik 48, pp. 1043-1054, 2000.
Makhlin et al., "Nano-electronic circuits as quantum bits", ISACS 2000 Geneva. IEEE International Symposium on Circuits and Systems. Emerging Technologies of the 21st century Geneva, Switzerland, 28-32, Mar. 2000, pp. 241-244 vol. 2, Mar. 1, 2000.
Makhlin et al., "Quantum-state engineering with Josephson-junction devices", arXIv:cond-mat/0011269v1, Nov. 15, 2000.
Manucharyan et al., "Fluxonium: single Cooper pair circuit free of charge offsets", arXiv:0906.0831v2, [cond-mat.mes-hall] Oct. 20, 2009, 13 pages.
Marquardt et al., "Superposition of tWo mesoscopically distinct quantum states: Coupling a Cooper-pair boX to a large superconducting island", Physical RevieW B, 63, pp. 054514-054520 (2001).
Martinis et al., "Rabi Oscillations in a Large Josephson-Junction Qubit," Physical Review Letters 89(11):117901-1-117901-4, Sep. 9, 2002.
Martinis, "Superconducting phase qubits," Quantum Inf Process 8:81-103, 2009.
Mc Hugh et al., "A quantum computer using a trapped-ion spin molecule and microwave radiation," arXiv:quant-ph/0310015v2, pp. 1-9, Apr. 13, 2004.
Mizuta, et al., "Quantum and Tunnelling Capacitance in Charge and Spin Qubits", arXiv:1604.02884v2 [cond-mat.mes-hall] Aug. 16, 2016, 9 pages.
Naaman et al., "On-Chip Josephson Junction Microwave Switch," arXiv:1512.01484v1, 10 pages, 2015.
Nagayama, et al., "Sureface code error correction on a defective lattice", IOP Publishing, New J. Phys. 19 (2017) 29 pages.

(56) References Cited

OTHER PUBLICATIONS

Neill, "A path towards quantum supremacy with superconducting qubits", PhD Thesis—University of California, Dec. 1, 2017.
Neven, "Suppressing quantum errors by scaling a surface code logical qubit", arXiv:2207.06431v1 [quant-ph] Jul. 13, 2022, 44 pages.
Nguyen et al, "Scalable High-Performance Fluxonium Quantum Processor", arXiv:2201.09374v2 [quant-ph] Feb. 5, 2022, 29 pages.
Orlando et al, "Flux-based Superconducting Qubits for Quantum Computation" Physica C 372-376, 194-200, 2002.
Orlando et al., "Engineering the Quantum Measurement Process for the Persistent Current Qubit", Physica C 3681294-299 (Mar. 2002).
Ortlepp et al., "Access Time and Power Dissipation of a Model 256-Bit Single Flux Quantum RAM", IEEE Transactions on Applied Superconductivity, vol. 24, No. 4, Aug. 2014.
Ortlepp et al., "Design Guidelines for Suzuki Stacks as Reliable High-speed Josephson Voltage Drivers", Superconductor Science Technology, 26 (2013) 035007 (12pp).
Paik, et al., "Observation of High Coherence in Josephson Junction Qubits Measured in a Three-dimensional Circuit QED Architecture", arXiv:1105.4652v4 [quant-ph], Nov. 2, 2011.
Plastina et al. "Communicating Josephson qubits", arXiv.org:cond-mat/0206586 (2002).
Pop, et al., "Experimental Demonstration of Aharonov-Casher Interference in a Josephson Junction Circuit", arXiv:1104.3999v1 [cond-mat.mess-hall], Apr. 20, 2011.
Poyatos et al., "Schemes of Quantum Computations With Trapped Ions", Fortschritte der Physik 48, pp. 785-799, 2000.
Pudenz, et al., "Error corrected quantum annealing with hundreds of qubits", arXiv:1307.8190v1 [quant-ph] Jul. 31, 2013, 18 pages.
Puri, et al., "Quantum Annealing with All-to-all Connected Nonlinear Oscillators", Nature Communications, vol. 8, Article No. 15785, Jun. 8, 2017, 9 pages.
Raussendorf, et al., "Fault-Tolerant quantum computation with high threshold in two dimensions", arXiv:quant-ph/0610082v2, May 14, 2007, 4 pages.
Rey-de-Castro et al., "Design of an RSFQ Control Circuit to Observe MQC on an rf-SQUID", IEEE Transactions on Applied Superconductivity 11, pp. 1014-1017 (2001).
Rocchetto et al., "Stabilisers as a design tool for new forms of Lechner-Hauke-Zoller Annealer", arXiv:1603.08554 [quant-ph], May 2, 2016. https://arxiv.org/abs/1603.08554.
Sendelbach, et al., "Complex Inductance, Excess Noise, and Surface Magnetism in dc SQUIDs", Physical Review Letters 103, 117001, Sep. 11, 2009.
Sete, et al., "Purcell Effect with Microwave Drive: Suppression of Qubit Relaxation Rate", arXiv: 1401.5545v2, Mar. 21, 2014, 15 pages.
Shi, et al., "Multiplexed control scheme for scalable quantum information processing with superconducting qubits", arXiv:2312.06911v1 [quant-ph] Dec. 12, 2023, 8 pages.
Simbierowicz, et al., "Flux-driven Josephson Parametric Amplifier for Sub-GHz Frequencies Fabricated with Side-wall Passivated Spacer Junction Technology", arXiv:1805.07307v1, May 18, 2018, 15 pages.
Spiller, "Superconducting Circuits for Quantum Computing," Fortschritte der Physik 48, pp. 1075-1094, 2000.
Tanaka et al., "DC SQUID Readout Readout for Qubit," Physica C, 3681300 304 (Mar. 2002).
Tang, et al., "Robust surface code topology against sparse fabrication defects in a superconducting-qubit array", Phys Rev. A 93. 032322—Published Mar. 15, 2018, 4 pages.
Van der Wal et al., "Quantum Superposition of Macroscopic Persistent current states", Science 290, pp. 773-777, 2000.
VanDenBrink "Mediated Tunable Coupling of Flux Qubits", New Journal of Physics 7 (2005) 230, Nov. 7, 2005.
Vandersypen et al., "Experimental realiZation of order-finding With a quantum computer", ArXiv.org:quant-ph/0007017, pp. 1-4 (2000).
Venegas-Andraca, et al., "A cross-disciplinary introduction to quantum annealing-base algorithms", Contemporary Physics, Quantum Annealing ArXiv:1803.03372v1 [puant-ph] Mar. 9, 2018, 31 pages.
Venturelli et al., Quantum Optimization of Fully-Connected Spin Glasses, arXiv:1406.7553v1 [cond-mat.dis-nn], Jun. 29, 2014.
Vion et al., "Manipulating the quantum state of an electrical circuit", Science, 296, pp. 886-889 (2002).
Wallraff, et al,, "Circuit Quantum Electrodynamics: Coherent Coupling of a Single Photon to a Cooper Pair Box", arXiv:cond-mat/0407325v1 [cond-mat.mess-hall], Jul. 13, 2004.
Wallraff, et al., "Approaching Unit Visibility for Control of a Superconducting Qubit with Dispersive Readout", arXiv:cond-mat/0502645v1 [cond-mat.mess-hall], Feb. 27, 2005.
Wang, et al., "Measurement of the Decay of Fock States in a Superconducting Quantum Circuit", arXiv:0808.3279v1 [cond-mat.mess-hall], Aug. 24, 2008.
Watanabe, M. et al., "Resonance-Free Low-Pass Filters for the AC Josephson Voltage Standard," IEEE Transactions on Applied Superconductivity, 16(1), Mar. 2006, 5 pages.
Wendin et al., "Superconducting Quantum Circuits, Qubits and Computing," arXiv:cond-mat/0508729v1 [cond-mat.supr-con], Aug. 30, 2005, 60 pages.
Wenner, et al., "Catching Time-Reversed Microwave Photons with 99.4% Absorption Efficiency", arXiv:1311.1180v2 [quant-ph], Nov. 16, 2013.
White et al., "Traveling wave parametric amplifier with Josephson junctions using minimal resonator phase matching", Applied Physics Letters 106, Jun. 15, 2015.
Yamamoto, "Flux Driven Josephson Parametric Amplifier", arXiv:0808.1386v1 [cond-mat.supr-con] 2008.
Yan et al., "A tunable coupling scheme for implementing high-fidelity two-qubit gates", Arxiv:1803.09813v1, Mar. 26, 2018.
Yinn, et al., "Controlled Catch and Release of Microwave Photon States", arXiv:1208.2950v1 [cond-mat.supr-con], Aug. 14, 2012.
Yu et al., "Coherent temporal oscillations of macroscopic quantum states in a Josephson junction", Science, 296, pp. 889-892, 2002.
Zagoskin—Superconducting Qubits, La Physique au Canada 63(4):215-227, 2007.
Zhang et al., "Non-constant bias current for do SQUID operation", Physica C 368, pp. 181-184, 2002.
Zhang et al., "Substrate resonator for HTS rf SQUID operation", Physica C 372-3761282-286 (2002).
Zhao, et al. "Two-photon Driven Kerr Resonator for Quantum Annealing with Three-dimensional Circuit QED", arXiv:1712.03613v2, Dec. 12, 2017, 13 pages.
Zhou et al, "Experimental Realization of Spin Liquids in a Programmable Quantum Device", arXiv:2009.07853v2, 2020.
Zorin, "Radio-Frequency Bloch-Transistor Electrometer", Phys. Rev. Lett. 86, pp. 3388-3391, 2001.
Semenov, et al., "Classical and Quantum Operation Modes of the Reversible Logic Circuits," Department of Physics and Astronomy, Stony Brook University, Stony Brook, New York, Presentation, Dec. 2006, 29 pages.

* cited by examiner

SYSTEMS AND METHODS FOR TUNING CAPACITANCE IN QUANTUM DEVICES

FIELD

This disclosure generally relates to quantum computing, and particularly to the design and operation of devices for tuning the physical characteristics of quantum devices.

BACKGROUND

Quantum Devices

Quantum devices are structures in which quantum mechanical effects are observable. Quantum devices include circuits in which current transport is dominated by quantum mechanical effects. Such devices include spintronics, where electronic spin is used as a resource, and superconducting circuits. A superconducting circuit is a circuit that includes a superconducting device. A superconducting device is a device that includes a superconducting material. A superconducting material is a material that has no electrical resistance below critical levels of current, magnetic field and temperature. Both spin and superconductivity are quantum mechanical phenomena. Quantum devices can be used for measurement instruments, in computing machinery, and the like.

Quantum Computation

Quantum computation and quantum information processing are active areas of research and define classes of vendible products. A quantum computer is a system that makes direct use of at least one quantum-mechanical phenomenon, such as superposition, tunneling, and entanglement, to perform operations on data. The elements of a quantum computer are quantum binary digits, known as qubits. Quantum computers hold the promise of providing exponential speedup for certain classes of computational problems such as computational problems simulating quantum physics. Useful speedup may exist for other classes of problems.

One model of quantum computing is adiabatic quantum computing. Adiabatic quantum computing can be suitable for solving hard optimization problems, for example. Further details on adiabatic quantum computing systems, methods, and apparatus are described, for example, in U.S. Pat. Nos. 7,135,701 and 7,418,283.

Quantum Annealing

Quantum annealing is a computational method that may be used to find a low-energy state of a system, typically preferably the ground state of the system. Similar in concept to classical simulated annealing, the method relies on the underlying principle that natural systems tend towards lower energy states because lower energy states are more stable. While classical annealing uses classical thermal fluctuations to guide a system to a low-energy state, quantum annealing may use quantum effects, such as quantum tunneling, as a source of delocalization to reach an energy minimum more accurately and/or more quickly than classical annealing. In quantum annealing, thermal effects and other noise may be present. The final low-energy state may not be the global energy minimum.

Adiabatic quantum computation may be considered a special case of quantum annealing. In adiabatic quantum computation, the system ideally begins and remains in its ground state throughout an adiabatic evolution. Thus, those of skill in the art will appreciate that quantum annealing systems and methods may generally be implemented on an adiabatic quantum computer. Throughout the present application, any reference to quantum annealing is intended to encompass adiabatic quantum computation unless the context requires otherwise.

Quantum Processor

A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

Superconducting qubits are solid state qubits based on circuits of superconducting materials. Operation of superconducting qubits is based on the underlying principles of magnetic flux quantization, and Josephson tunneling. Superconducting effects can be present in different configurations and can give rise to different types of superconducting qubits including flux, phase, charge, and hybrid qubits. The different configurations can vary in the topology of the loops, the placement of the Josephson junctions, and the physical parameters of elements of the superconducting circuits, such as inductance, capacitance, and Josephson junction critical current.

In one implementation, the superconducting qubit includes a superconducting loop interrupted by a Josephson junction. The ratio of the inductance of the Josephson junction to the geometric inductance of the superconducting loop can be expressed as $2\pi L I_C/\Phi_0$ (where L is the geometric inductance, $I_C$ is the critical current of the Josephson junction, and $\Phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of exemplary quantum processors that may be used in conjunction with the present systems and devices are described in, for example, US U.S. Pat. Nos. 7,533,068; 8,008,942; 8,195,596; 8,190,548; and 8,421,053.

Superconducting Qubits

A quantum processor can be a superconducting quantum processor that includes superconducting qubits. Wendin G. and Shumeiko V. S., "SUPERCONDUCTING QUANTUM CIRCUITS, QUBITS AND COMPUTING" (arXiv:cond-mat/0508729v1, 2005), provides an introduction to the physics and principles of operation of quantized superconducting electrical circuits for quantum information processing.

Coupling

Couplers can provide communicative coupling between quantum devices in a quantum processor. Coupling can be, for example, between adjacent and/or non-adjacent qubits. Unless expressly indicated otherwise, as used herein and in the claims, the terms couple, couples, coupling and variations of such refer to direct or indirect communicative coupling or communications between two or more components.

Quantum devices, such as qubits and couplers, may possess various characteristics, such as flux, persistent current, inductance, capacitance, and so on. Such characteristics can affect the results of quantum computations performed by such qubits, and so it may be desirable to tune one or more of those characteristics to align with the parameters of a given computation. Example systems and methods for tuning qubit characteristics, including example qubits and couplers, are provided by U.S. Pat. No. 9,152,923 and PCT Application No. US2018/066613.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

According to an aspect, there is provided a quantum processor comprising a first current path comprising a capacitance, an inductance, and a first loop, a Josephson structure interrupting the first loop, the Josephson structure comprising at least one Josephson junction, a second current path extending from and electrically connected to the first current path at a first end and a second end, the second current path comprising a first node spaced from a second node, a capacitor separating the first node and the second node, and a voltage gain tuner, the voltage gain tuner being inductively coupled to the inductance of the first current path, a flux line bias coupled to the voltage gain tuner, and wherein the flux line bias controls the voltage gain tuner to vary a voltage ratio between the first node and the second node, thereby influencing the capacitance of the first current path.

According to other aspects, the second current path may be electrically connected in parallel with the first loop, the second current path may be electrically connected in series with the first loop, the voltage gain tuner may comprise a quantum flux parametron, the first loop and the Josephson structure may comprise a qubit, the flux bias line may receive a programming signal, the first current path and the second current path may comprise a superconducting material, and the superconducting material may comprise at least one of: Nb, Al, WSi, MON, NbN, NbTiN, and TiN.

According to an aspect, there is provided a method of tuning an effective capacitance of a device in a quantum processor, the method performed by a processor in communication with the quantum processor and comprising determining a target capacitance of the device, measuring the effective capacitance of the device, computing a difference between the target capacitance and the effective capacitance, and in response to the difference being greater than a threshold value introducing a flux bias to a voltage gain tuner, the voltage gain tuner inductively coupled to an inductance of the device and positioned on a current path electrically connected at a first end and a second end to the device, such that a voltage ratio between a first node on the current path and a second node on the current path separated from the first node on the current path by a capacitor is varied, and controlling the flux bias to reduce the difference between the target capacitance and the effective capacitance.

According to other aspects, introducing the flux bias to the voltage gain tuner may comprise applying a programming signal through a flux bias line, determining the target capacitance of the device may comprise determining the target capacitance of a qubit, determining the target capacitance of the qubit may comprise retrieving a fabrication target capacitance shared by a plurality of qubits including the qubit, determining the target capacitance of the device may comprise determining the target capacitance of a coupler, and determining the target capacitance of the coupler may comprise retrieving a fabrication target capacitance shared by a plurality of couplers including the coupler.

According to an aspect, there is provided a method of tuning qubit capacitance, the method being performed by one or more processors, the one or more processors communicatively coupled to a quantum processor, the method comprising transmitting instructions to the quantum processor to evolve from an initial state to a final state over a time interval, the quantum processor comprising a qubit, the qubit comprising a capacitance, introducing a flux bias to a voltage gain tuner, the voltage gain tuner inductively coupled to the qubit and positioned on a current path electrically connected to the qubit at a first end and a second end, such that a voltage ratio between a first node on the current path and a second node on the current path separated from the first node on the current path by a capacitor is varied, and controlling the flux bias according to a time dependent signal to vary the capacitance of the qubit over the time interval.

According to another aspect, the quantum processor may comprise a plurality of qubits, and controlling the flux bias according to a time dependent signal may comprise controlling the flux bias of a plurality of voltage gain tuners to vary the capacitance of the plurality of qubits over the time interval.

In other aspects, the features described above may be combined together in any reasonable combination as will be recognized by those skilled in the art.

BRIEF DESCRIPTION OF THE SEVERAL
VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" intends that that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Exemplary Computing System

Figure 1:
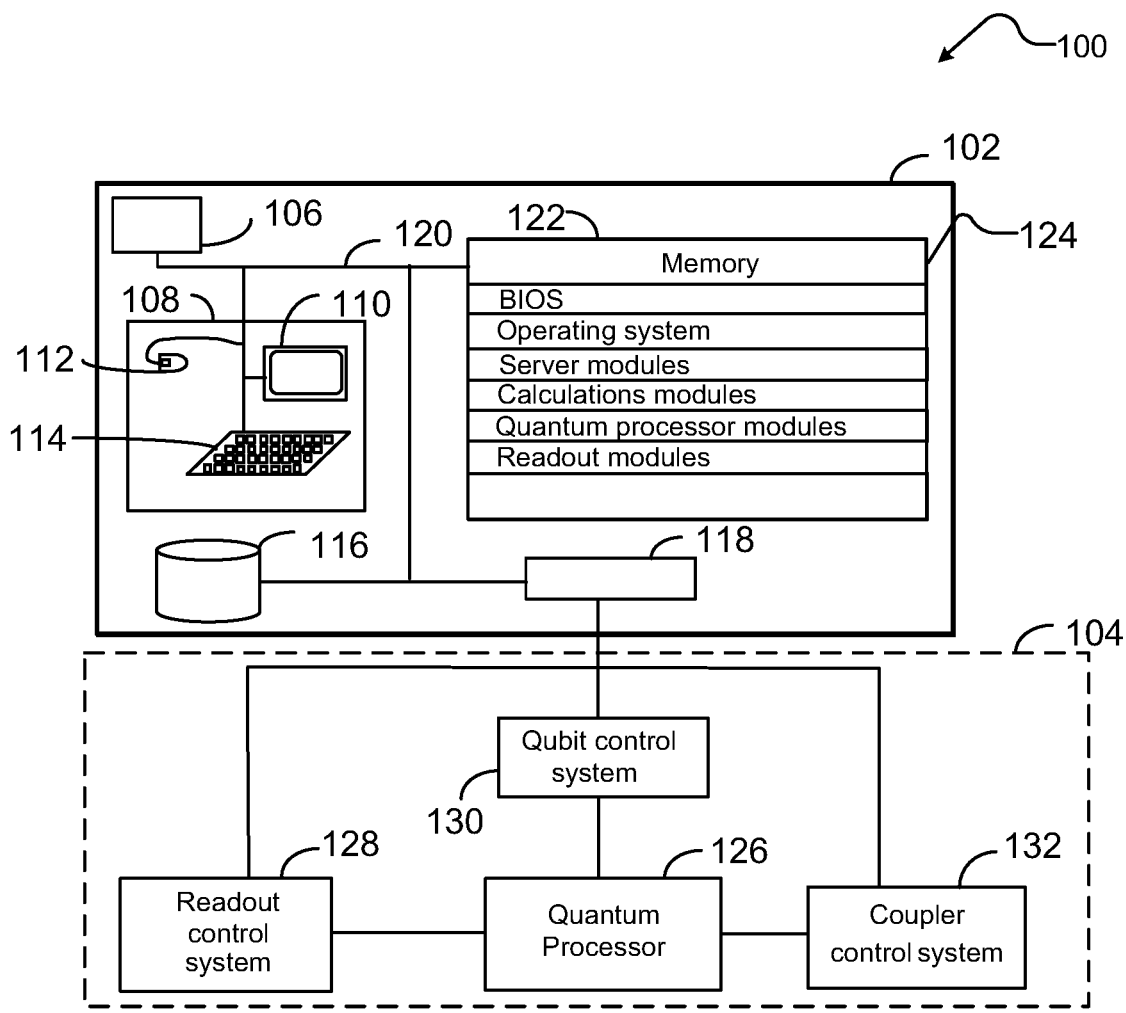
FIG. 1 is a schematic diagram of a hybrid computing system including a digital computer coupled to an analog computer, in accordance with the present systems, devices, and methods.

FIG. 1 illustrates a computing system 100 comprising a digital computer 102. The example digital computer 102 includes one or more digital processors 106 that may be used to perform classical digital processing tasks. Digital computer 102 may further include at least one system memory 122, and at least one system bus 120 that couples various system components, including system memory 122 to digital processor(s) 106. System memory 122 may store a set of modules 124.

The digital processor(s) 106 may be any logic processing unit or circuitry (for example, integrated circuits), such as one or more central processing units ("CPUs"), graphics processing units ("GPUs"), digital signal processors ("DSPs"), application-specific integrated circuits ("ASICs"), programmable gate arrays ("FPGAs"), programmable logic controllers ("PLCs"), etc., and/or combinations of the same.

In some implementations, computing system 100 comprises an analog computer 104, which may include one or more quantum processors 126. Quantum processor 126 may include at least one superconducting integrated circuit fabricated using systems and methods described in the present application. Digital computer 102 may communicate with analog computer 104 via, for instance, a controller 118. Certain computations may be performed by analog computer 104 at the instruction of digital computer 102, as described in greater detail herein.

Digital computer 102 may include a user input/output subsystem 108. In some implementations, the user input/output subsystem includes one or more user input/output components such as a display 110, mouse 112, and/or keyboard 114.

System bus 120 may employ any known bus structures or architectures, including a memory bus with a memory controller, a peripheral bus, and a local bus. System memory 122 may include non-volatile memory, such as read-only memory ("ROM"), static random access memory ("SRAM"), Flash NAND; and volatile memory such as random access memory ("RAM") (not shown).

Digital computer 102 may also include other non-transitory computer- or processor-readable storage media or non-volatile memory 116. Non-volatile memory 116 may take a variety of forms, including: a hard disk drive for reading from and writing to a hard disk (for example, a magnetic disk), an optical disk drive for reading from and writing to removable optical disks, and/or a solid state drive (SSD) for reading from and writing to solid state media (for example NAND-based Flash memory). Non-volatile memory 116 may communicate with digital processor(s) via system bus 120 and may include appropriate interfaces or controllers 118 coupled to system bus 120. Non-volatile memory 116 may serve as long-term storage for processor- or computer-readable instructions, data structures, or other data (sometimes called program modules) for digital computer 102.

Although digital computer 102 has been described as employing hard disks, optical disks and/or solid-state storage media, those skilled in the relevant art will appreciate that other types of nontransitory and non-volatile computer-readable media may be employed. Those skilled in the relevant art will appreciate that some computer architectures employ nontransitory volatile memory and nontransitory non-volatile memory. For example, data in volatile memory may be cached to non-volatile memory or a solid-state disk that employs integrated circuits to provide non-volatile memory.

Various processor- or computer-readable instructions, data structures, or other data may be stored in system memory 122. For example, system memory 122 may store instruction for communicating with remote clients and scheduling use of resources including resources on the digital computer 102 and analog computer 104. Also, for example, system memory 122 may store at least one of processor executable instructions or data that, when executed by at least one processor, causes the at least one processor to execute the various algorithms to execute instructions. In some implementations system memory 122 may store processor- or computer-readable calculation instructions and/or data to perform pre-processing, co-processing, and post-processing to analog computer 104. System memory 122 may store a set of analog computer interface instructions to interact with analog computer 104.

Analog computer 104 may include at least one analog processor such as quantum processor 126. Analog computer 104 may be provided in an isolated environment, for example, in an isolated environment that shields the internal elements of the quantum computer from heat, magnetic field, and other external noise. The isolated environment may include a refrigerator, for instance a dilution refrigerator, operable to cryogenically cool the analog processor, for example to temperature below approximately 1 K.

Analog computer 104 may include programmable elements such as qubits, couplers, and other devices. Qubits may be read out via readout system 128. Readout results may be sent to other computer- or processor-readable instructions of digital computer 102. Qubits may be controlled via a qubit control system 130. Qubit control system 130 may include on-chip Digital to Analog Converters (DACs) and analog lines that are operable to apply a bias to a target device. Couplers that couple qubits may be controlled via a coupler control system 132. Coupler control system 132 may include tuning elements such as on-chip DACs and analog lines. Qubit control system 130 and coupler control system 132 may be used to implement a quantum annealing schedule as described herein on analog processor 104. Programmable elements may be included in quantum processor 126 in the form of an integrated circuit. Qubits and couplers may be positioned in layers of the integrated circuit that comprise a first material. Other devices, such as readout control system 128, may be positioned in other layers of the integrated circuit that comprise a second material.

Exemplary Superconducting Quantum Processor

Figure 2:
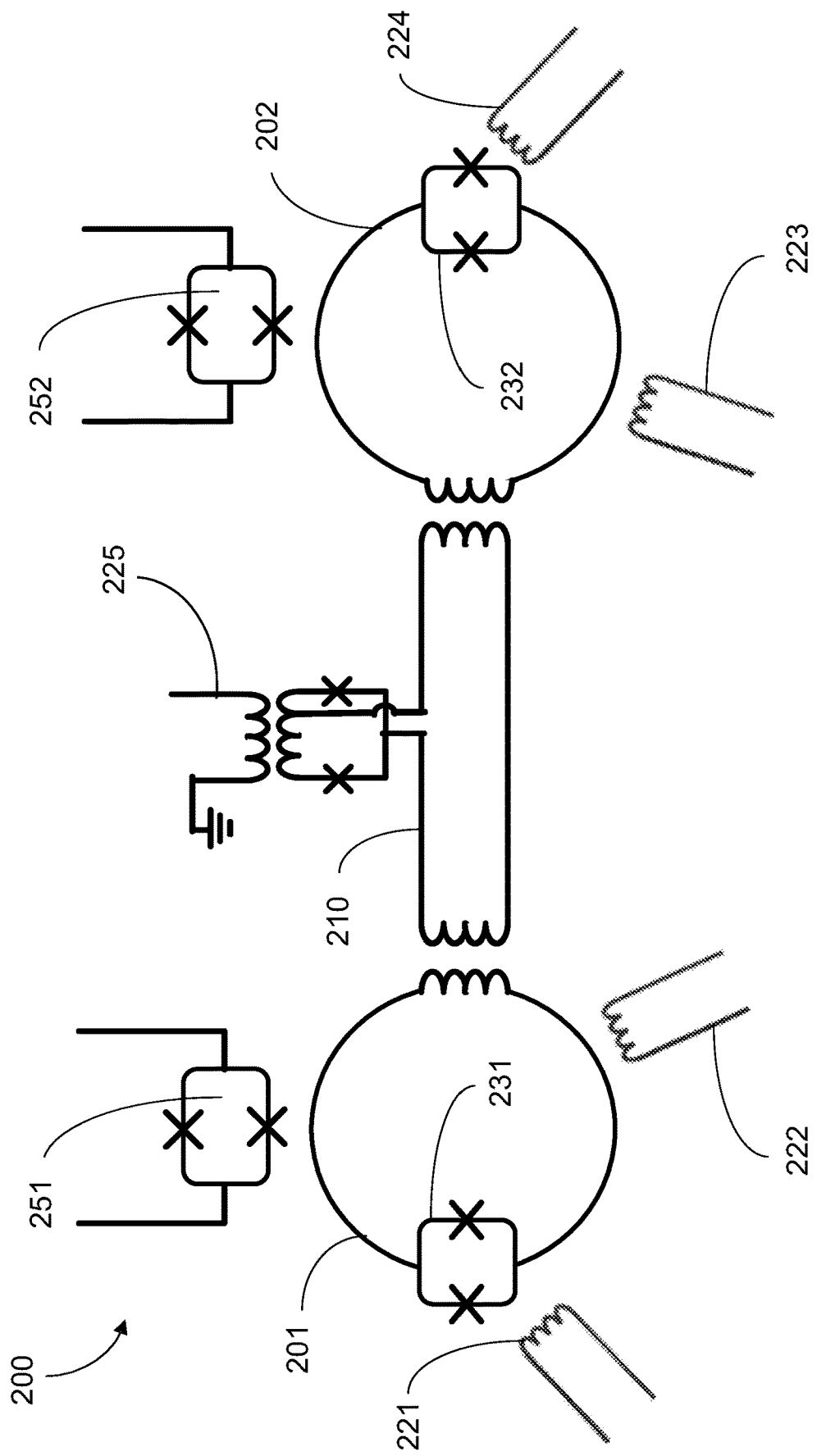
FIG. 2 is a schematic diagram of a portion of an exemplary superconducting quantum processor.

FIG. 2 is a schematic diagram of a portion of an exemplary superconducting quantum processor 200, according to at least one implementation. In some implementations, quantum processor 126 of FIG. 1 may include quantum processor 200. The portion of superconducting quantum processor 200 shown in FIG. 2 includes two superconducting qubits 201, and 202. Also shown is a tunable coupling (diagonal coupling) via coupler 210 between qubits 201 and 202 (i.e., providing 2-local interaction). While the portion of quantum processor 200 shown in FIG. 2 includes only two qubits 201, 202 and one coupler 210, those of skill in the art will appreciate that quantum processor 200 may include any number of qubits and any number of couplers coupling information between them.

Quantum processor 200 includes a plurality of interfaces 221, 222, 223, 224, 225 (i.e., 221-225) that are used to configure and control the state of quantum processor 200. Each of interfaces 221-225 may be realized by a respective inductive coupling structure, as illustrated, as part of a programming subsystem and/or an evolution subsystem. Alternatively, or in addition, interfaces 221-225 may be realized by a galvanic coupling structure. In some implementations, one or more of interfaces 221-225 may be driven by one or more DACs. Such a programming subsystem and/or evolution subsystem may be separate from quantum processor 200, or may be included locally (i.e., on-chip with quantum processor 200).

In the operation of quantum processor 200, interfaces 221 and 224 may each be used to couple a flux signal into a respective compound Josephson junction 231 and 232 of qubits 201 and 202, thereby realizing a tunable tunneling term in the system Hamiltonian. This coupling provides the off-diagonal $\sigma^x$ terms of the Hamiltonian and these flux signals are examples of "delocalization signals".

Similarly, interfaces 222 and 223 may each be used to apply a flux signal into a respective qubit loop of qubits 201 and 202, thereby realizing the $h_i$ terms (dimensionless local fields for the qubits) in the system Hamiltonian. This coupling provides the diagonal $\sigma^z$ terms in the system Hamiltonian. Furthermore, interface 225 may be used to couple a flux signal into coupler 210, thereby realizing the $J_{ij}$ term(s) (dimensionless local fields for the couplers) in the system Hamiltonian. This coupling provides the diagonal $\sigma_i^z \sigma_j^z$ terms in the system Hamiltonian. Examples of Hamiltonians (and their terms) used in quantum computing are described in greater detail in, for example, US Publication No. 20140344322.

Throughout this specification and the appended claims, the term "quantum processor" is used to generally describe a collection of physical qubits (e.g., qubits 201 and 202) and couplers (e.g., coupler 210). The physical qubits 201 and 202 and the coupler 210 are referred to as the "programmable devices" of the quantum processor 200 and their corresponding parameters (e.g., the qubit $h_i$ values and the coupler $J_{ij}$ values) are referred to as the "programmable parameters" of the quantum processor. In the context of a quantum processor, the term "programming subsystem" is used to generally describe the interfaces (e.g., "programming interfaces" 222, 223, and 225) used to apply the programmable parameters to the programmable devices of the quantum processor 200 and other associated control circuitry and/or instructions. With reference to FIG. 1, in an example implementation, programming interfaces of quantum processor 126 may be controlled by qubit control system 130 and coupler control system 132.

As previously described, the programming interfaces of the programming subsystem may communicate with other subsystems which may be separate from the quantum processor or may be included locally on the processor. The programming subsystem may be configured to receive programming instructions in a machine language of the quantum processor and execute the programming instructions to program the programmable devices in accordance with the programming instructions. Similarly, in the context of a quantum processor, the term "evolution subsystem" generally includes the interfaces (e.g., "evolution interfaces" 221 and 224) used to evolve the programmable devices of the quantum processor 200 and other associated control circuitry and/or instructions. For example, the evolution subsystem may include annealing signal lines and their corresponding interfaces (221, 224) to the qubits (201, 202).

Quantum processor 200 also includes readout devices 251 and 252, where readout device 251 is associated with qubit 201 and readout device 252 is associated with qubit 202. In some implementations, such as shown in FIG. 2, each of readout devices 251 and 252 includes a direct current superconducting quantum interference device (DC-SQUID) inductively coupled to the corresponding qubit. In the context of quantum processor 200, the term "readout subsystem" is used to generally describe the readout devices 251, 252 used to read out the final states of the qubits (e.g., qubits 201 and 202) in the quantum processor to produce a bit string. The readout subsystem may also include other elements, such as routing circuitry (e.g., latching elements, a shift register, or a multiplexer circuit) and/or may be arranged in alternative configurations (e.g., an XY-addressable array, an XYZ-addressable array, etc.), any of which may comprise DACs. Qubit readout may also be performed using alternative circuits, such as that described in PCT Patent Publication WO2012064974. With reference to FIG. 1, in an example implementation, readout subsystems of quantum processor 126 may be controlled by readout control system 128.

While FIG. 2 illustrates two physical qubits 201, 202, one coupler 210, and two readout devices 251, 252, a quantum processor (e.g., processor 200, quantum processor 126) may employ any number of qubits, couplers, and/or readout devices, including a larger number (e.g., hundreds, thousands or more) of qubits, couplers and/or readout devices. The application of the teachings herein to processors with a different (e.g., larger) number of computational components should be readily apparent to those of ordinary skill in the art.

Examples of superconducting qubits include superconducting flux qubits, superconducting charge qubits, and the like. In a superconducting flux qubit, the Josephson energy dominates or is equal to the charging energy. In a charge qubit the energy relationship is the reverse. Examples of flux qubits that may be used include radio frequency superconducting quantum interference devices (RF-SQUIDs), which include a superconducting loop interrupted by one Josephson junction, persistent current qubits, which include a superconducting loop interrupted by three Josephson junctions, and the like.

Qubits and L-Tuners

Figure 3:
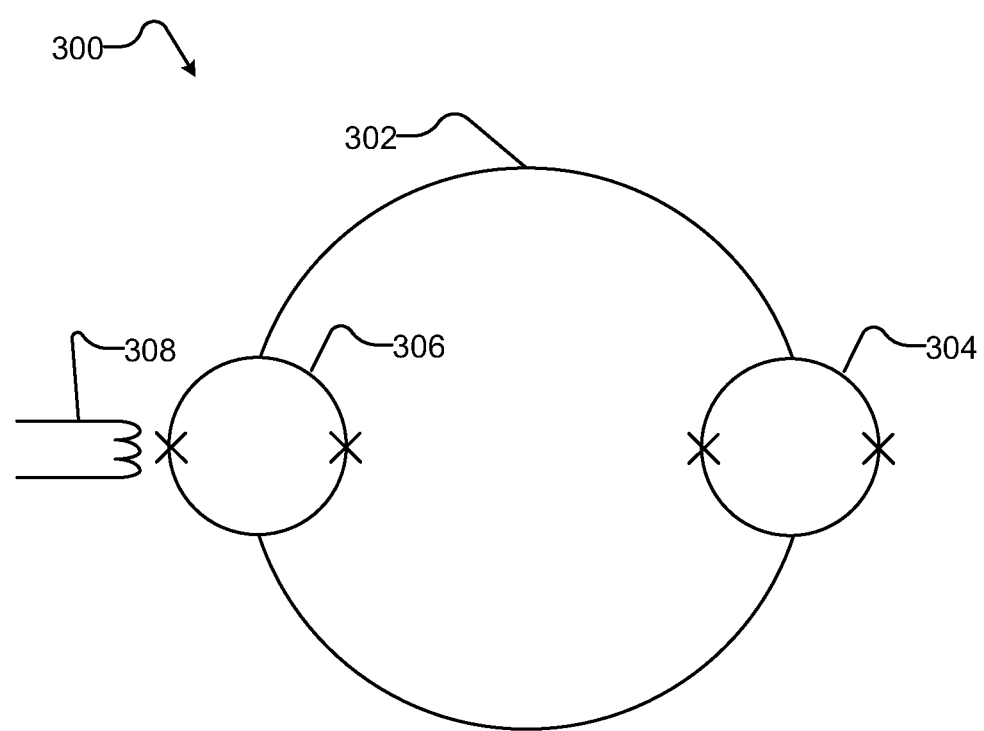
FIG. 3 is a schematic diagram of an exemplary qubit with an inductance tuner.

FIG. 3 is a schematic diagram of an implementation of a superconducting flux qubit 300, similar to qubits 201 and 202 of FIG. 2. Qubit 300 has a first superconducting loop 302 and compound Josephson junction (CJJ) structure 304. Qubit 300 also has an inductance tuner (or "L-tuner") CJJ structure 306 connected in series with CJJ structure 304 in qubit loop 302. As described, for example, in U.S. Pat. No. 9,152,923, L-tuner CJJ structure 306 may be tuned using a programmable interface 308, such as by inductively coupling control signals to CJJ structure 306 and thus tuning the Josephson inductance of CJJ structure 306 and, by extension, of qubit 300.

Qubit 300 may be coupled to other devices inductively or otherwise, as discussed, for example, with respect to FIG. 2. In some implementations, qubit 300 may be inductively coupled to other qubits via inter-qubit couplers (not shown, see coupler 210 of FIG. 2). Such couplings can affect the electromagnetic properties of qubit 300. For example, the capacitance of qubit 300 may be a complex function of coupler and L-tuner settings. In some implementations tuning couplers and L-tuners can cause changes in qubit capacitance, potentially causing errors in calibration, coupler-dependent desynchronization of qubit dynamics, and other difficult-to-address behavior.

In some implementations, it may be beneficial to tune the inductance of the circuit. When using an inductance tuner (L-tuner) to increase or decrease the inductance of a circuit, there may also be a resulting change to the capacitance of the circuit. In order to counteract this effect, it may be beneficial to have an independent capacitance tuner (C-tuner). Providing a C-tuner may also be beneficial in that the C-tuner may enable orthogonal persistent current and tunneling energy control in the qubit. The current of the qubit loop can impact the outcome of quantum processes, such as quantum annealing. In particular, during the annealing process, persistent current in the qubit increases and tunneling energy decreases. This may result in the superposition of states becoming separated, or, when considering a double well potential, may result in the wells having less coupling, and thereby reducing the likelihood of tunneling between the wells. As this effect is central to the quantum annealing process, it may be beneficial to provide structures allowing for some control over the tunneling energy of the qubit. One implementation of a structure that may affect the tunneling energy is a capacitance tuner, as the capacitance of the circuit influences the tunneling energy of the qubit.

As discussed above, it may be beneficial to calibrate components of a quantum processor in order to adjust or compensate for fabrication variation, as well as to adjust or compensate for the effects of L-tuners and couplers, and to influence the tunneling energy. In order to control capacitance of the qubits, it may be beneficial to provide a capacitance tuner (C-tuner). One implementation of a capacitance tuner is described in U.S. Pat. No. 9,152,923.

Figure 4:
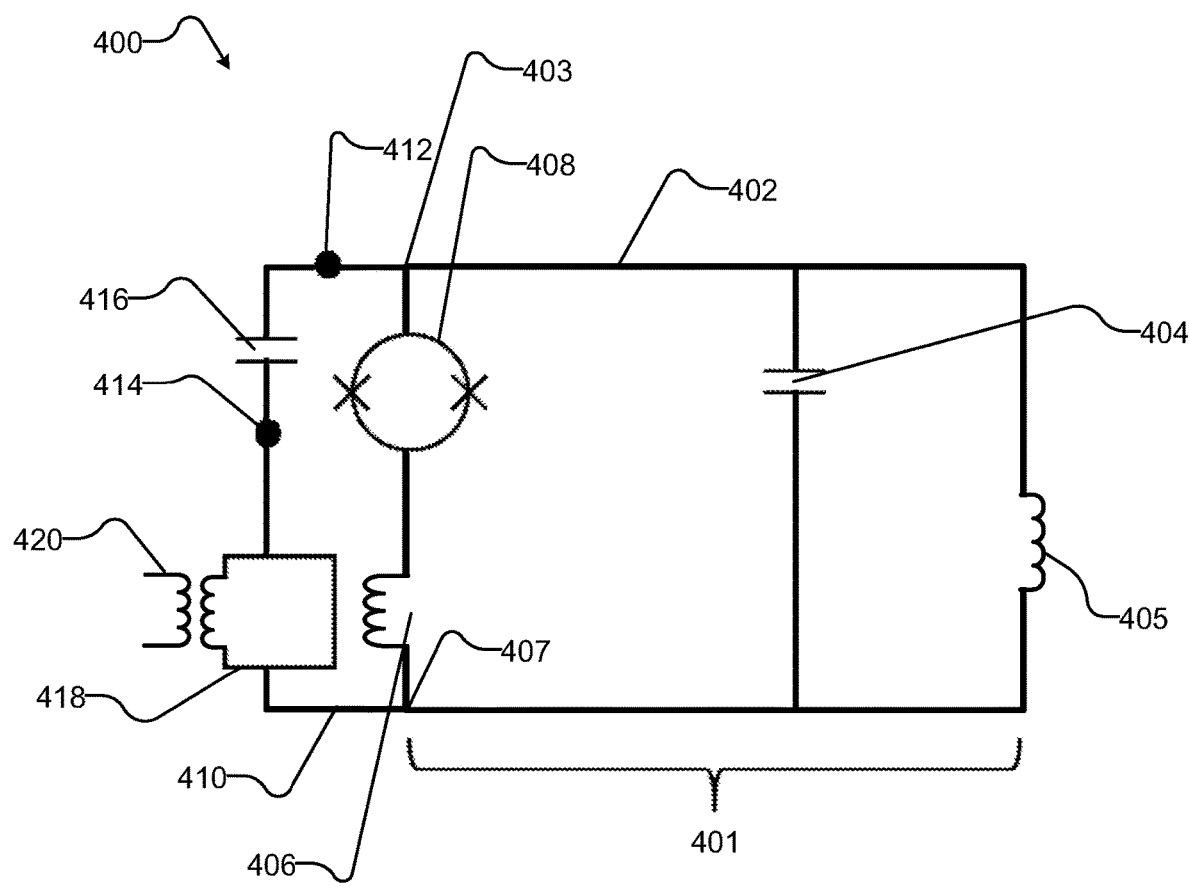
FIG. 4 is a schematic diagram of an implementation of a superconducting integrated circuit with a capacitance tuner.

An implementation of a capacitance tuner is shown in FIG. 4. Circuit 400 forms part of a quantum processor, examples of which are discussed above with respect to FIG. 1 and FIG. 2. Circuit 400 has a first current path 401 with a capacitance 404, an inductance 406, and a first loop 402. It will be understood that capacitance 404 and inductance 406 may or may not take the form of discrete capacitors and inductors. First current path 401 may also have additional inductances such as 405. First loop 402 is interrupted by Josephson structure 408. In the example implementation of FIG. 4, Josephson structure 408 is a compound Josephson junction. However, it will be understood that Josephson structure 408 may also be a single Josephson junction, a compound-compound Josephson junction, or another structure having at least one Josephson junction. As used herein, compound-compound Josephson junction refers to a Josephson Junction where one or more of the junctions within a compound Josephson junction is itself a compound Josephson junction. In some implementations, first current path 401 is a qubit and first loop 402 and Josephson structure 408 make up the qubit, as discussed with reference to FIGS. 2 and 3. It will be understood that first loop 402 and Josephson structure 408 may also make up other structures for which is desired to tune the capacitance, such as a coupler. Second current path 410 is electrically connected to first current path 401 at a first end 403 and a second end 407 and has a first node 412 spaced from a second node 414, with capacitor 416 separating first node 412 and second node 414. Second current path 410 has a voltage gain tuner 418 inductively coupled to inductance 406 of first current path 401. Voltage gain tuner 418 may, for example, be an amplifier, a quantum flux parametron (QFP), or an equivalent device operable to tune voltage gain. A flux bias line 420 is coupled to voltage gain tuner 418 and controls voltage gain tuner 418 to vary a voltage ratio between first node 412 and second node 414, thereby influencing the capacitance of first current path 401. Flux bias line 420 may, in some implementations, receive a programming signal to control the applied flux bias.

Figure 5:
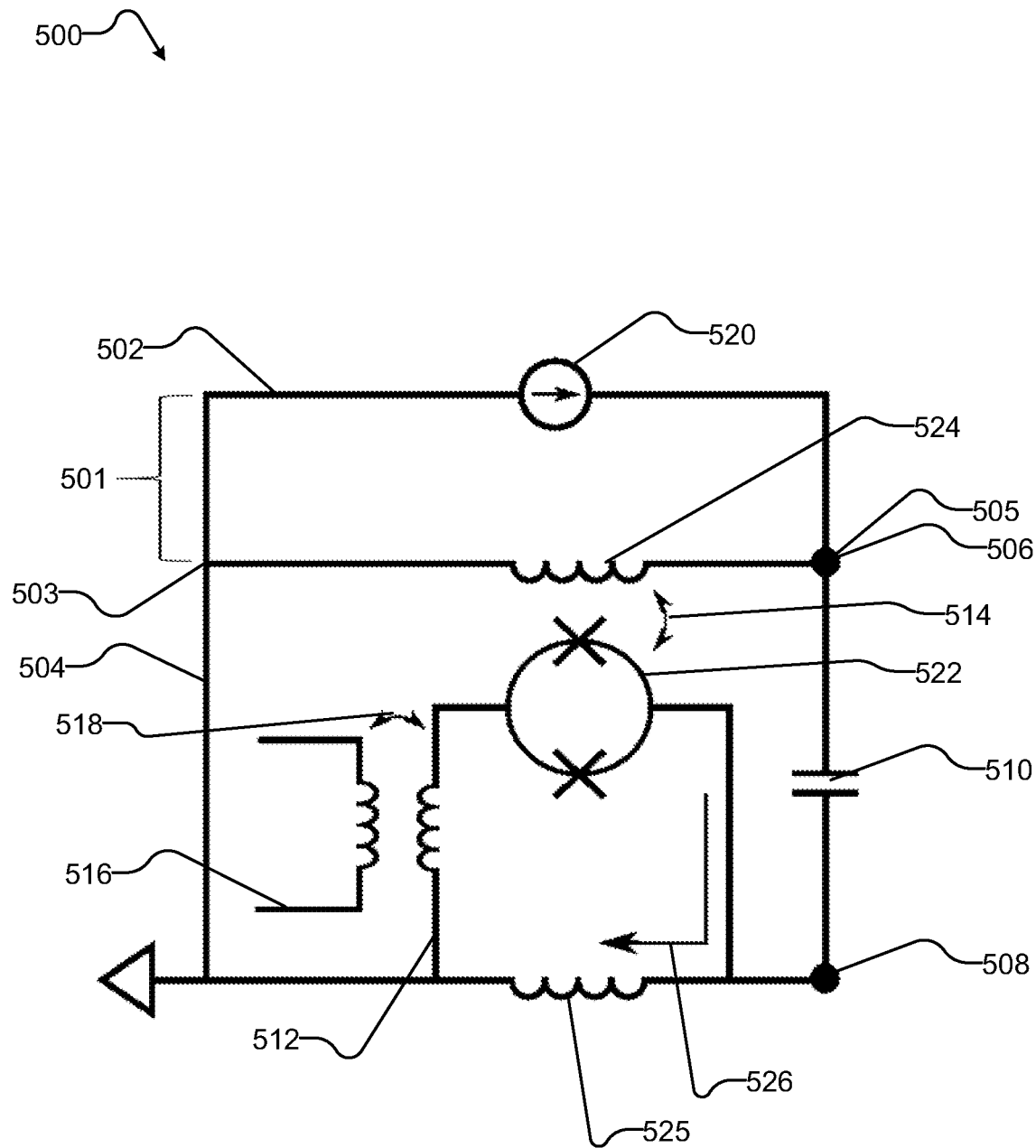
FIG. 5 is a schematic diagram of another implementation of a superconducting integrated circuit with a capacitance tuner.

In some implementations, first current path 401 and second current path 410 may be formed from a superconducting material, such as Nb, Al, WSi, MON, NbN, NbTiN, and TiN. In some implementations, voltage gain tuner 418 may be a quantum flux parametron, as shown in FIG. 5.

Referring to FIG. 4, the first and second current paths may be arranged with the second current path in parallel with the first loop 402. In other implementations, for example, the implementation shown in FIG. 6, the second current path may be electrically connected in parallel with the first loop. In the implementation shown in FIG. 7, the second current path may be electrically connected in series with the first loop.

The Miller Effect

The Miller effect refers to the increase in capacitance of a circuit due to a voltage difference between an input and output terminal. Referring to FIG. 5, circuit 500 has first current path 501 with a first loop 502 and second current path 504 connected to first current path 501 at a first end 503 and a second end 505. Second current path 504 has first node 506 and second node 508, with capacitor 510 separating first node 506 and second node 508. A voltage gain tuner 512 in the form of a compound radio frequency superconducting quantum interference device (RF-SQUID) is connected to second current path 504. Voltage gain tuner 512 is inductively coupled to first current path 501 at 514 and is inductively coupled to flux bias line 516 at 518. When there is a current gain inside voltage gain tuner 512, $v_1$, the voltage defined at node 506, and $v_2$, the voltage defined at node 508, can be controlled. The effective capacitance can be defined as $$C_{\textit{eff}} = C\left(1 - \frac{v_2}{v_1}\right),$$

where C is the capacitance of capacitor 510. The voltage gain can be changed by the flux inside voltage gain tuner 512, and therefore, applying different flux within voltage gain tuner 512 through flux bias line 516 allows the capacitance within circuit 500 to be varied, thereby influencing the capacitance of first current path 501.

In the example implementation of FIG. 5, the current $I_{cij}$ at 520 will provide flux $\Phi_{cij}$ to compound Josephson junction (CJJ) loop 522. An external flux $\Phi_x$ is provided by flux bias line 516 to the body of voltage gain tuner 512. The combination of these two fluxes sets the voltage gain across capacitor 510. The voltages defined at first node 506 can be expressed as $$v_1 = L \frac{dI_{cij}}{dt}$$

and the voltage at second node 508 can be expressed as $$v_2 = L_g \frac{dI}{dt}$$

with the assumption that most of the current is directed through inductance 524, and where L is the inductance at inductance 524 and $L_g$ is the inductance at inductor 525 within voltage gain tuner 512. Therefore, $$\frac{v_2}{v_1} = \frac{L_g}{L} \frac{dI}{dI_{cij}},$$

and the capacitance can be changed by changing the voltage gain, by varying $$L_g, L, \text{ and } \frac{dI}{dI_{cij}}.$$

The total current in the body (I) is shown at 526.

Referring now to the example implementation of FIG. 6, circuit 600 has a first current path 601 having a first loop 602 forming a qubit and a second current path 604 connected at a first end 603 and a second end 605 to first current path 601, where the coupling inductance 606 is positioned in series with the qubit body inductance 608 of first current path 601 ($L_q$ in the equations below). First node 610 has voltage $v_1$, and second node 612 has voltage $v_2$, with capacitor 614 separating first node 610 and second node 612. First current path 601 has a capacitance 618, and first loop 602 has a Josephson structure 616. Voltage gain tuner 620 has a body inductance 622 ($L_g$ in the equations below), a coupling to a flux bias 624, and a CJJ 626 coupled at 628 to coupling inductance 606 ($L_c$ in the equations below). It will be understood that capacitance 618 and inductances 606, 608, and 622 may or may not take the form of discrete capacitors and inductors. Similar principles apply to capacitances and inductances in the discussions below. In this implementation, the voltage 26 gain ratio is defined as $$\frac{v_2}{v_1} = \frac{L_g}{L_q + L_c} \frac{dI}{dI_{cij}},$$

with the inductances ($L_g$, $L_q$, $L_c$) defined as above and I being the total current in the body and $I_{cij}$ being the current in first current path 601. Voltage gain tuner 620 may be used to vary the voltage on one side of capacitor 614, thereby providing an effective change to the capacitance of the device being controlled (in this case, first current path 601 including loop 602 forming a qubit. In some implementations, setting external flux $\Phi_x$ provided by a flux bias to 624, may allow for a voltage gain tuning range of ±25%, which may result in a tunable capacitance of approximately 50% of the original capacitance of circuit 600. Voltage gain tuner 620 may be in communication with a flux bias line, as shown in FIGS. 4 and 5.

Figure 6:
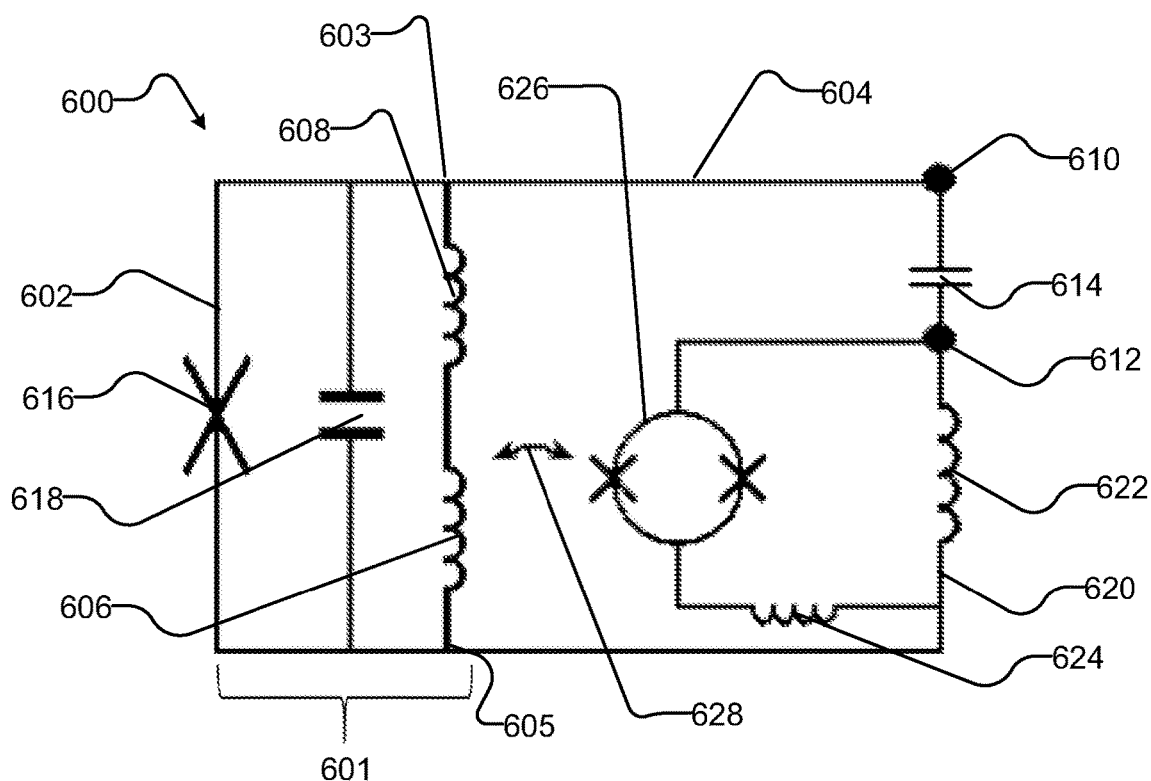
FIG. 6 is a schematic diagram of an implementation of a superconducting integrated circuit with a capacitance tuner having a voltage gain tuner connected in series.
Figure 7:
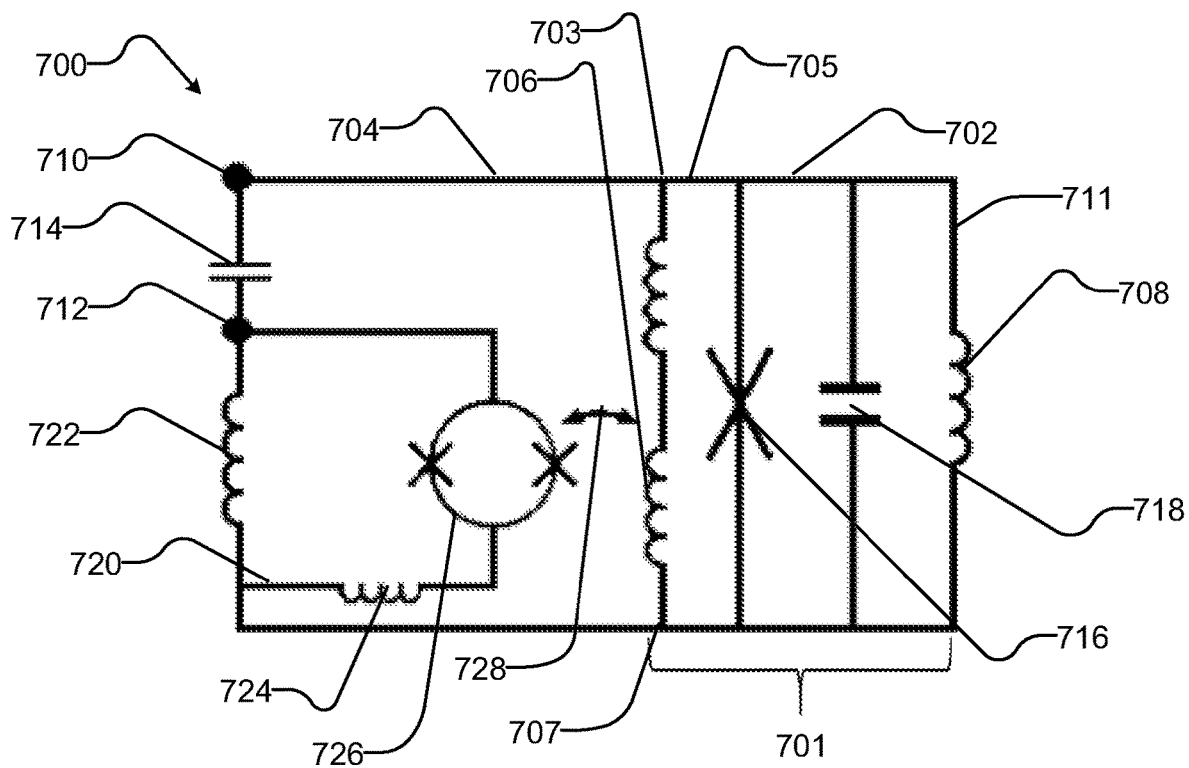
FIG. 7 is a schematic diagram of an implementation of a superconducting integrated circuit with a capacitance tuner having a voltage gain tuner connected in parallel.

In the example implementations of FIGS. 6 and 7, voltage gain tuners 620 and 720 are QFP devices having a direct current (DC) SQUID with a loop inductor 622/722. The CJJ loop is coupled to the qubit inductance 606/706. This coupling may be either in series, as shown in FIG. 6, or in parallel, as shown in FIG. 7. As discussed above, the Miller effect provides the ability to tune the capacitance by varying the voltage ratio between node 610/710 and node 612/712. In particular, the effective capacitance can be defined as:

$$C_{\textit{eff}} = C\left(1 - \frac{v_2}{v_1}\right).$$

The voltage gain can be altered by the flux inside voltage gain tuner 620/720, which can be controlled using a flux bias. Applying different flux to voltage gain tuner 620/720 will therefore allow for tuning of the capacitance.

If $$\frac{v_2}{v_1} = 1,$$

the capacitance given by $$C_{\textit{eff}} = C\left(1 - \frac{v_2}{v_1}\right)$$

can be suppressed to zero. If $$\frac{v_2}{v_1} > 1,$$

negative capacitance is possible. In some implementations this may be beneficial to compensate for stray capacitance. Parasitic capacitance within the circuit may cause errors, and the introduction of negative capacitance may allow for calibration, adjustment, or compensation to offset or compensate for the positive stray capacitance. This may also increase the energy scale of the circuit. It will be understood that multiple devices as described with reference to any of the implementations discussed herein may be included within a single circuit. For example, if the voltage gain is not sufficiently large to provide the full range of capacitance tuning desired, additional voltage gain tuner loops may be added to increase the voltage gain.

Referring to the example implementation of FIG. 7, circuit 700 has a first current path 701 with a first loop 702 forming a qubit and a second current path 704 extending from and electrically connected to first current path 701 at first end 703 and second end 707, where the coupling inductance 706 is positioned in parallel with the qubit body inductance 708. First node 710 has voltage 11, and second node 712 has voltage 12, with capacitor 714 separating first node 710 and second node 712. First current path 701 has a capacitance 718, and a qubit 711 is formed by first loop 702, which includes qubit body inductance 708 and a Josephson structure 716. Voltage gain tuner 720 has a body inductance 722, a coupling to a flux bias 724, and a CJJ 726 coupled at 728 to coupling inductance 706. In contrast with the implementation shown in FIG. 6, in the example implementations of FIG. 7, an additional current path 705 within first current path 701 may beneficially avoid adding extra inductance to the body of qubit 711 and may increase the resonance frequency of qubit 711. This may compensate for the additional capacitance that may result from adding the capacitance tuner structure of second loop 704. This may, in some implementations, maintain the energy scale of qubit 711. In some implementations, this may result in a tunable capacitance of approximately 60% of the original capacitance of circuit 700. Voltage gain tuner 720 may be in communication with a flux bias line, as shown in FIGS. 4 and 5.

In some implementations, it may be beneficial to place the capacitance tuner (C-tuner) close to the Josephson junction structure of the qubit in order to reduce parasitic inductance. The material of the qubit and the C-tuner may, for example, be superconducting materials such as Nb, Al, and high kinetic inductance materials.

Figure 8:
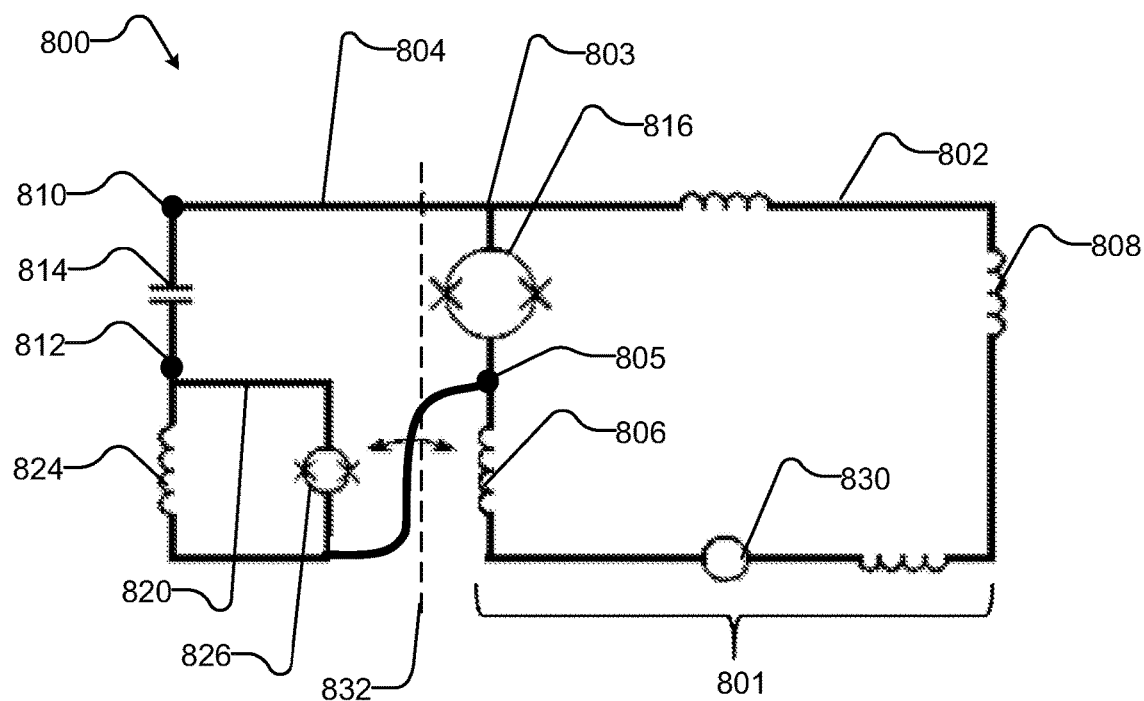
FIG. 8 is a schematic diagram of another implementation of a superconducting integrated circuit with a capacitance tuner having a voltage gain tuner connected in series.
Figure 9:
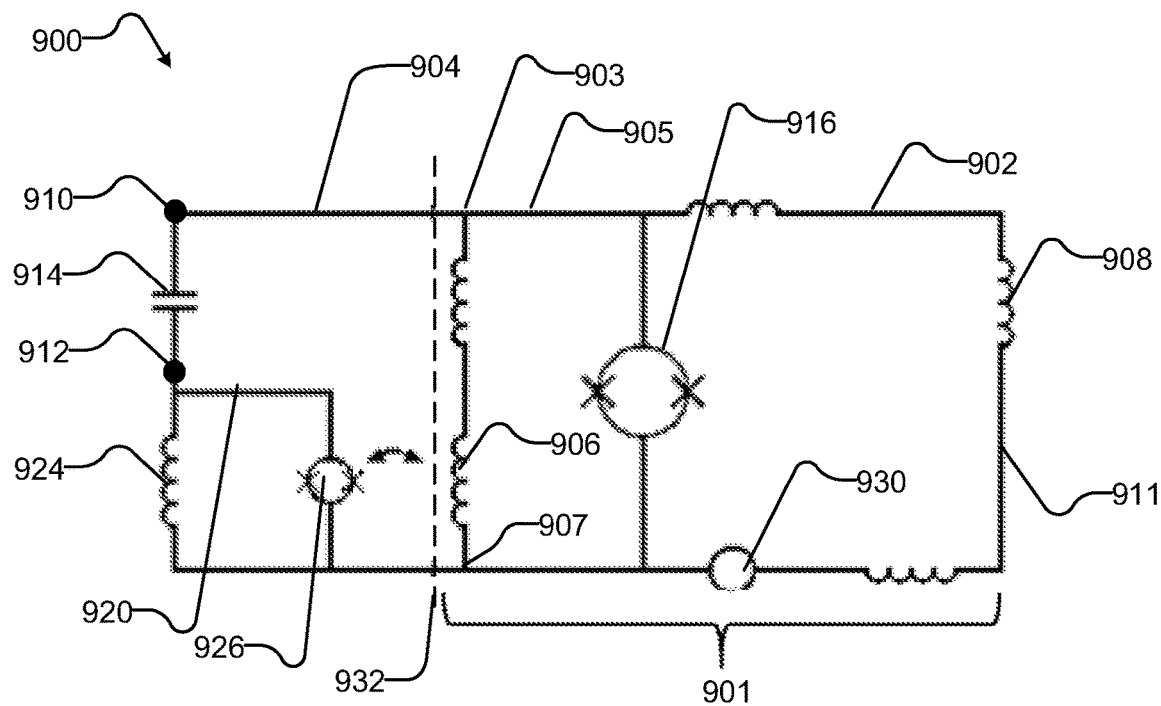
FIG. 9 is a schematic diagram of another implementation of a superconducting integrated circuit with a capacitance tuner having a voltage gain tuner connected in parallel.

Referring now to FIG. 8 and FIG. 9, other examples of implementations with the C-tuner in parallel and in series are shown. In FIG. 8, circuit 800 has a first current path 801 with a first loop 802 and a second current path 804 connected to first current path 801 at first end 803 and second end 805, a coupling inductance 806, a body inductance 808, and a Josephson structure 816. First node 810 is separated from second node 812 by capacitance 814. Voltage gain tuner 820 has a coupling to flux bias 824 and a CJJ 826 coupled to coupling inductance 806. In the example implementation of FIG. 8, like numbers to FIG. 6 refer to like elements (e.g., first loop 602 and first loop 802), and similar principles apply to those discussed above. Line 832 (provided for drawing clarity and not representing a structure) separates first current path 801, which may be a qubit formed from first loop 802 and CJJ 816, from C-tuner 804. An L-tuner 830 may be provided for the qubit. Voltage gain tuner 820 may be in communication with a flux bias line, as shown in FIGS. 4 and 5.

In FIG. 9, circuit 900 has a first current path 901 with a first loop 902 and a second current path 904 connected at 903 and 907, a coupling inductance 906, a body inductance 908, and a Josephson structure 916. First node 910 is separated from second node 912 by capacitance 914. Voltage gain tuner 920 has a coupling to flux bias 924 and a CJJ 926 coupled to coupling inductance 906. In the example implementation of FIG. 9, like numbers to FIG. 7 refer to like elements, and similar principles apply to those discussed above. First loop 902 and CJJ 916 may form a qubit 911, with an L-tuner 930 that may be provided for qubit 911. Line 932 separates first current path 901 from C-tuner 904. Voltage gain tuner 920 may be in communication with a flux bias line, as shown in FIGS. 4 and 5.

In FIG. 8 and FIG. 9, the feedback provided by the inductive coupling to the body inductance 806/906 of the first current path and the capacitor 814/914 allows for the voltage to be varied between the first node 810/910 and the second node 812/912, and thereby allows the impedance to be changed, and changing the impedance allows for changing the capacitance, according to the Miller effect as discussed above. The additional current path 905 in FIG. 9 may allow for a lower body inductance and a higher resonance. This may also compensate for the added capacitance due to the C-tuner structure and may boost the energy scale of the circuit. The C-tuner structure discussed above could be coupled to a qubit, a coupler, or other structure within a quantum processor.

Figure 10:
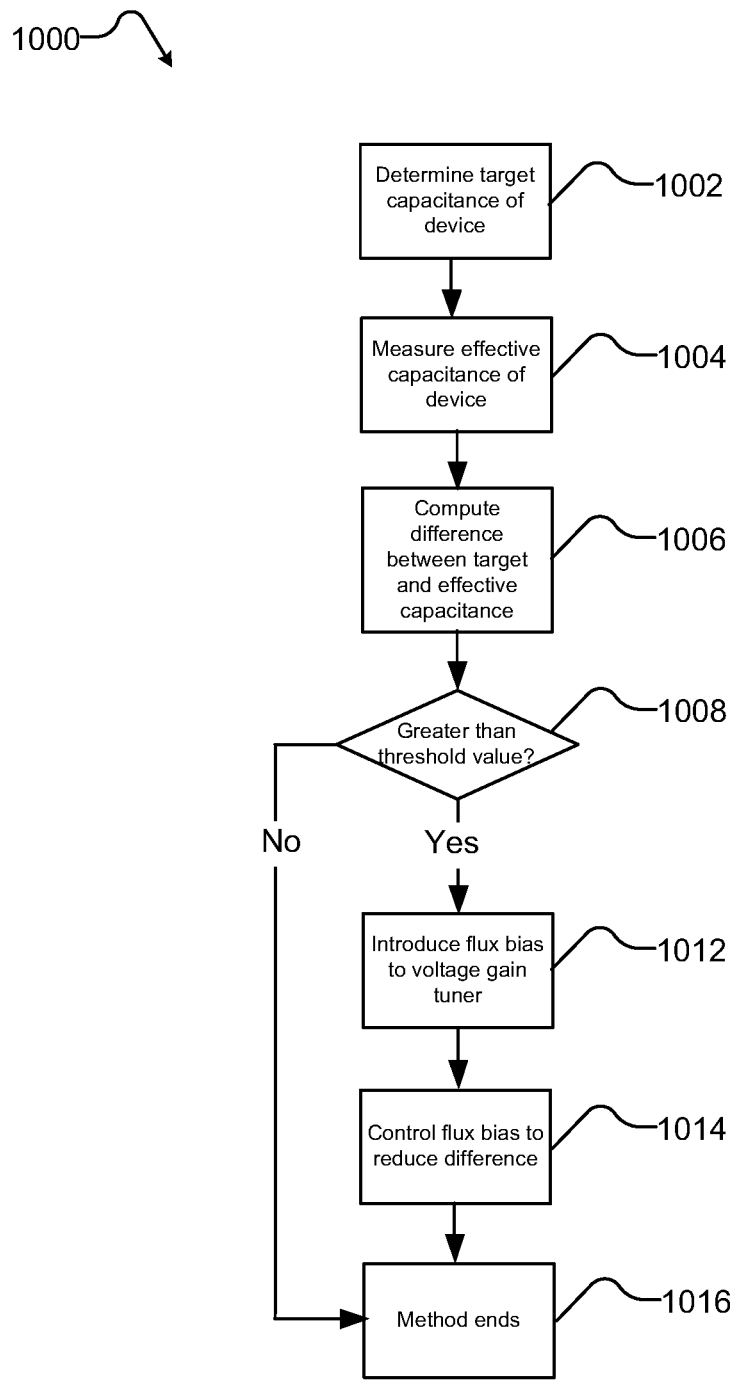
FIG. 10 is a flow chart of a method of tuning an effective capacitance of a device in a quantum processor.

FIG. 10 is a flowchart of a method 1000 for tuning an effective capacitance of a qubit in a quantum processor, according to the systems and methods of the present disclosure. Method 1000 includes acts 1002, 1004, 1006, 1008, 1010, 1012, 1014 and 1016, although those of skill in the art will appreciate that in other implementations certain acts may be omitted and/or additional acts may be added. Those of skill in the art will appreciate that the illustrated order of the acts in FIG. 10 is shown for exemplary purposes only and may change in other implementations. Method 1000 is performed by a computing system (comprising a processor and memory) in communication with a quantum processor. The quantum processor may be one of the implementations discussed above with respect to FIGS. 4 through 9, with reference to FIGS. 1 and 2, and in particular, may include a qubit or a coupler with a voltage gain tuner as discussed above.

At 1002, the processor determines a target capacitance for the device. It will be understood that where the target capacitance of the device is known, or is the same for each device under consideration, the act of determining the target capacitance may be the retrieval of the value from the memory of the computing system. The target capacitance may be a fabrication target capacitance for a qubit or a coupler. The target capacitance may be determined by retrieving a target capacitance shared by a plurality of qubits, such as a calibrated capacitance for each qubit of the plurality of qubits. The target capacitance may be selected to bring the qubit's capacitance approximately into alignment with the capacitance of the plurality of qubits, e.g., compensating for differences between a measured, effective or "as fabricated" capacitance and the target capacitance. Such calibration of qubits' capacitance may be directed to calibrating the qubits to have substantially uniform characteristics (namely capacitance). In this context, "substantially uniform" refers to characteristics being within an acceptable deviation from each other to achieve the desired accuracy in quantum computations. This may also be referred to as characteristics being uniform to within a predetermined margin of error. Similarly, this may include determining a target capacitance for a plurality of couplers and bringing the coupler's capacitance approximately into alignment with the capacitance of the plurality of couplers. In some implementations, determining a target capacitance comprises retrieving an intrinsic capacitance of the qubit or coupler, such as from memory, a database, and/or another repository. The intrinsic capacitance may be based on a capacitance of a capacitor that is part of the qubit.

At 1004, the processor measures the effective capacitance of the device.

At 1006, the processor computes or otherwise determines a difference between the target capacitance and the effective capacitance.

At 1008, the processor compares the difference to a threshold value. Where the difference is smaller than the threshold value, the method proceeds to act 1016, where it ends. The method may restart at act 1002 or 1004 for another device.

At 1012, in response to the difference being greater than a threshold value, a flux bias is introduced to a voltage gain tuner, as discussed in further detail above. The voltage gain tuner is inductively coupled to the device and positioned on a current path electrically connected at both ends to the device, such that a voltage ratio between a first node on the current path and a second node on the current path separated from the first node on the current path by a capacitor is varied by the introduction of the flux bias. The flux bias may be introduced to the voltage gain tuner by applying a programming signal through a flux bias line.

At 1014, the flux bias is controlled to reduce the difference between the target capacitance and the effective capacitance. In some implementations, this may include reducing the difference to below the threshold value. In other implementations this may include reducing the difference to be very small or zero, such that the target capacitance and the effective capacitance are effectively or approximately equal. In an implementation, this may be done incrementally, with the flux bias being increased in increments, and measurement of the effective capacitance of the device being done at each increment and compared to the target capacitance and the threshold difference value.

At 1016, the method ends, until it begins again, such as for another device, or after an event that may change the capacitance of the device.

Figure 11:
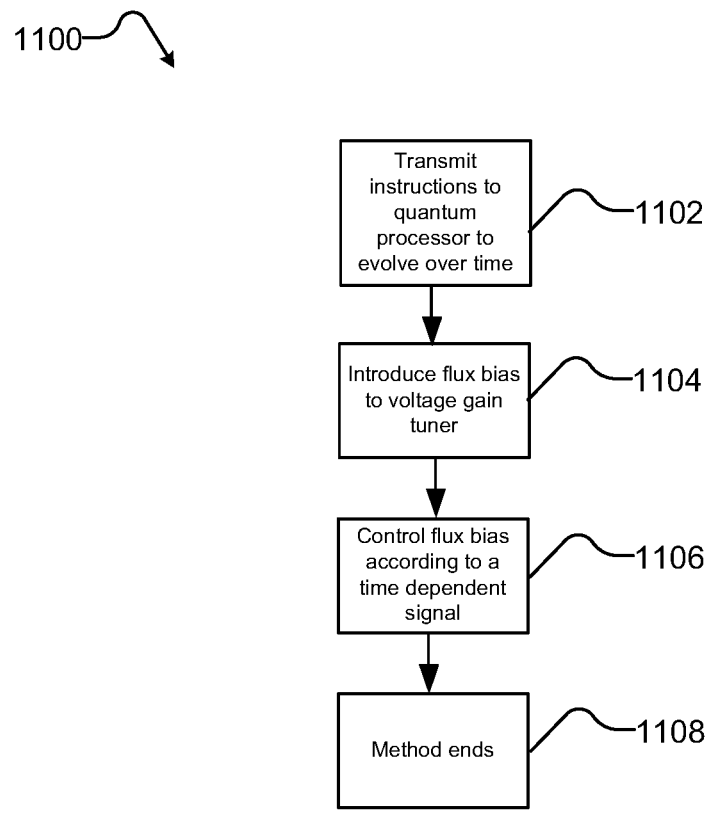
FIG. 11 is a flowchart of a method of tuning qubit capacitance.

FIG. 11 is a flow chart of method 1100 for tuning qubit capacitance, according to the systems and methods of the present disclosure. Method 1100 may include tuning qubit capacitance over time. Method 1100 includes acts 1102, 1104, 1106 and 1108, although those of skill in the art will appreciate that in other implementations certain acts may be omitted and/or additional acts may be added. Those of skill in the art will appreciate that the illustrated order of the acts in FIG. 11 is shown for exemplary purposes only and may change in other implementations. Method 1100 is performed by a processor in communication with a quantum processor. The quantum processor has at least one qubit and may be one of the implementations discussed above with respect to FIGS. 4 through 9, in the context of FIGS. 1 and 2.

At 1102, the processor transmits instructions to the quantum processor to evolve from an initial state to a final state over a time interval. These instructions may, for example, include an initial programmed state of the qubit, and quantum evolution parameters. In some implementations, the evolution may be quantum annealing, and the instructions may include an annealing schedule.

At 1104, the processor introduces a flux bias to a voltage gain tuner, for example, through a programming signal. The voltage gain tuner is inductively coupled to the qubit and positioned on a current path electrically connected to the qubit at both ends, such that a voltage ratio between a first node on the current path and a second node on the current path separated from the first node on the current path by a capacitor is varied.

At 1106, the flux bias is controlled according to a time dependent signal to vary the capacitance of the qubit over the time interval of the annealing. In some implementations the quantum processor may have a plurality of qubits, and the time dependent signal may control the flux bias of a plurality of voltage gain tuners to vary the capacitance of the plurality of qubits over the time interval of the annealing. The signal applied to the voltage gain tuner of each qubit may be uniform (e.g., to within a margin of error of the processor), or different signals may be applied for different qubits, such as where the initial calibration of the qubits finds variation between the qubits, or where the capacitance is varied based on model parameters, such as coupling strengths between qubits or other factors based on the problem it is desired to solve using the quantum processor.

At 1108, the method ends, until, for example, it begins again.

In some implementations, this method may allow for the coupling between the double welled potential of the qubit (the delta) to be increased, maintained, or the drop in delta reduced, over the course of the evolution of the processor.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Pat. Nos. 7,135,701; 7,418,283; 9,152,923; U.S. Patent Application Publication No. 20140344322; International Publication No. WO 2019/126396; and U.S. Patent Application No. 63/225,022.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A quantum processor comprising:
 a first current path comprising a capacitance, an inductance, and a first loop;
 a Josephson structure interrupting the first loop, the Josephson structure comprising at least one Josephson junction;
 a second current path extending from and electrically connected to the first current path at a first end and a second end, the second current path comprising:
  a first node spaced from a second node;
  a capacitor separating the first node and the second node; and
 a voltage gain tuner, the voltage gain tuner being inductively coupled to the inductance of the first current path;
 a flux bias line coupled to the voltage gain tuner; and
 wherein the flux bias line controls the voltage gain tuner to vary a voltage ratio between the first node and the second node, thereby influencing the capacitance of the first current path.

2. The quantum processor of claim 1, wherein the second current path is electrically connected in parallel with the first loop.

3. The quantum processor of claim 1, wherein the second current path is electrically connected in series with the first loop.

4. The quantum processor of claim 1, wherein the voltage gain tuner comprises a quantum flux parametron.

5. The quantum processor of claim 1, wherein the first loop and the Josephson structure comprise a qubit.

6. The quantum processor of claim 1, wherein the flux bias line receives a programming signal.

7. The quantum processor of claim 1, wherein the first current path and the second current path comprise a superconducting material.

8. The quantum processor of claim 7, wherein the superconducting material comprises at least one of: Nb, Al, WSi, MON, NbN, NbTiN, and TiN.

9. A method of tuning an effective capacitance of a device in a quantum processor, the method performed by a processor in communication with the quantum processor and comprising:
 determining a target capacitance of the device;
 measuring the effective capacitance of the device;
 computing a difference between the target capacitance and the effective capacitance; and
 in response to the difference being greater than a threshold value:
 introducing a flux bias to a voltage gain tuner, the voltage gain tuner inductively coupled to an inductance of the device and positioned on a current path electrically connected at a first end and a second end to the device, such that a voltage ratio between a first node on the current path and a second node on the current path separated from the first node on the current path by a capacitor is varied; and
 controlling the flux bias to reduce the difference between the target capacitance and the effective capacitance.

10. The method of claim 9, wherein introducing the flux bias to the voltage gain tuner comprises applying a programming signal through a flux bias line.

11. The method of claim 9, wherein determining the target capacitance of the device comprises determining the target capacitance of a qubit.

12. The method of claim 11, wherein determining the target capacitance of the qubit comprises retrieving a fabrication target capacitance shared by a plurality of qubits including the qubit.

13. The method of claim 9, wherein determining the target capacitance of the device comprises determining the target capacitance of a coupler.

14. The method of claim 13, wherein determining the target capacitance of the coupler comprises retrieving a fabrication target capacitance shared by a plurality of couplers including the coupler.

15. A method of tuning qubit capacitance, the method being performed by one or more processors, the one or more processors communicatively coupled to a quantum processor, the method comprising:
 causing the quantum processor to evolve from an initial state to a final state over a time interval, the quantum processor comprising a qubit, the qubit comprising a capacitance;
 introducing a flux bias to a voltage gain tuner, the voltage gain tuner inductively coupled to the qubit and positioned on a current path electrically connected to the qubit at a first end and a second end, such that a voltage ratio between a first node on the current path and a second node on the current path separated from the first node on the current path by a capacitor is varied; and
 controlling the flux bias according to a time dependent signal to vary the capacitance of the qubit over the time interval.

16. The method of claim 15, wherein the quantum processor comprises a plurality of qubits, and wherein controlling the flux bias according to a time dependent signal comprises controlling the flux bias of a plurality of voltage gain tuners to vary the capacitance of the plurality of qubits over the time interval.

17. The method of claim 15, wherein causing the quantum processor to evolve from an initial state to a final state over a time interval comprises causing the quantum processor to perform quantum annealing.

* * * * *